United States Patent
Okunaka et al.

(10) Patent No.: US 6,936,409 B2
(45) Date of Patent: Aug. 30, 2005

(54) ORGANIC-ELECTROLUMINESCENCE DEVICE, PROCESS FOR ITS PRODUCTION AND ORGANIC-ELECTROLUMINESCENCE DISPLAY SYSTEM

(75) Inventors: Masaaki Okunaka, Fujisawa (JP); Takashi Inoue, Yokohama (JP); Yoshiharu Nagae, Hitachi (JP); Yuji Mori, Naka (JP)

(73) Assignee: Hitachi, Ltd., Tokyo (JP)

( * ) Notice: Subject to any disclaimer, the term of this patent is extended or adjusted under 35 U.S.C. 154(b) by 14 days.

(21) Appl. No.: 10/260,564

(22) Filed: Oct. 1, 2002

(65) Prior Publication Data

US 2003/0068583 A1 Apr. 10, 2003

Related U.S. Application Data

(62) Division of application No. 09/908,859, filed on Jul. 20, 2001, now Pat. No. 6,696,181.

(30) Foreign Application Priority Data

Nov. 30, 2000 (JP) ........................... 2000-365976

(51) Int. Cl.[7] ............................................... H01J 9/227
(52) U.S. Cl. ........................................ 430/321; 313/504
(58) Field of Search ............................... 430/319, 320, 430/321; 313/504

(56) References Cited

U.S. PATENT DOCUMENTS

| 4,950,950 A | 8/1990 | Perry et al. |
|---|---|---|
| 5,484,821 A | 1/1996 | Mandal et al. |
| 5,705,309 A | 1/1998 | West et al. |
| 5,763,134 A | 6/1998 | Busman et al. |
| 5,922,481 A * | 7/1999 | Etzbach et al. ............. 428/690 |
| 6,322,909 B1 | 11/2001 | Sakaguchi |
| 6,358,652 B1 | 3/2002 | Tomiuchi et al. |
| 6,454,966 B1 | 9/2002 | Kobayashi et al. |
| 6,572,987 B2 | 6/2003 | Seo |
| 2002/0041979 A1 | 4/2002 | Taguchi |
| 2002/0096995 A1 | 7/2002 | Mishima et al. |

FOREIGN PATENT DOCUMENTS

| JP | 61-262737 | | 11/1986 |
|---|---|---|---|
| JP | 3-105894 A | * | 5/1991 |
| JP | 06-220438 | | 8/1994 |
| JP | 07-281435 | | 10/1995 |
| JP | 11-008069 A | * | 1/1999 |

OTHER PUBLICATIONS

Office Action mailed Feb. 4, 2003, in U.S. Appl. No. 09/908,859, filed Jul. 20, 2001.
Tang, et al., "Organic Electroluminescent Diodes", Appl. Phys. Lett. 51(12), Sep. 21, 1987, pp. 913–915.
Abstract of JP 11–008069 (Jan. 12, 1999), Patent Abstract of Japan.

\* cited by examiner

*Primary Examiner*—John A. McPherson
(74) *Attorney, Agent, or Firm*—Antonelli, Terry, Stout & Kraus, LLP

(57) ABSTRACT

A composition containing a high-molecular compound having as a photo-crosslinkable group any of a cinnamoyl group, a cinnamylidene group, a chalcone residual group, an isocoumarin residual group, a 2,5-dimethoxystilbene residual group, a thymine residual group, a styrylpyridinium residual group, an α-phenylmaleimide residual group, an anthracene residual group and a 2-pyrone residual group, or an aromatic bisazide, is cross-linked by light irradiation via a mask to cure the composition in a prescribed pattern to form photoemission layers.

14 Claims, 26 Drawing Sheets

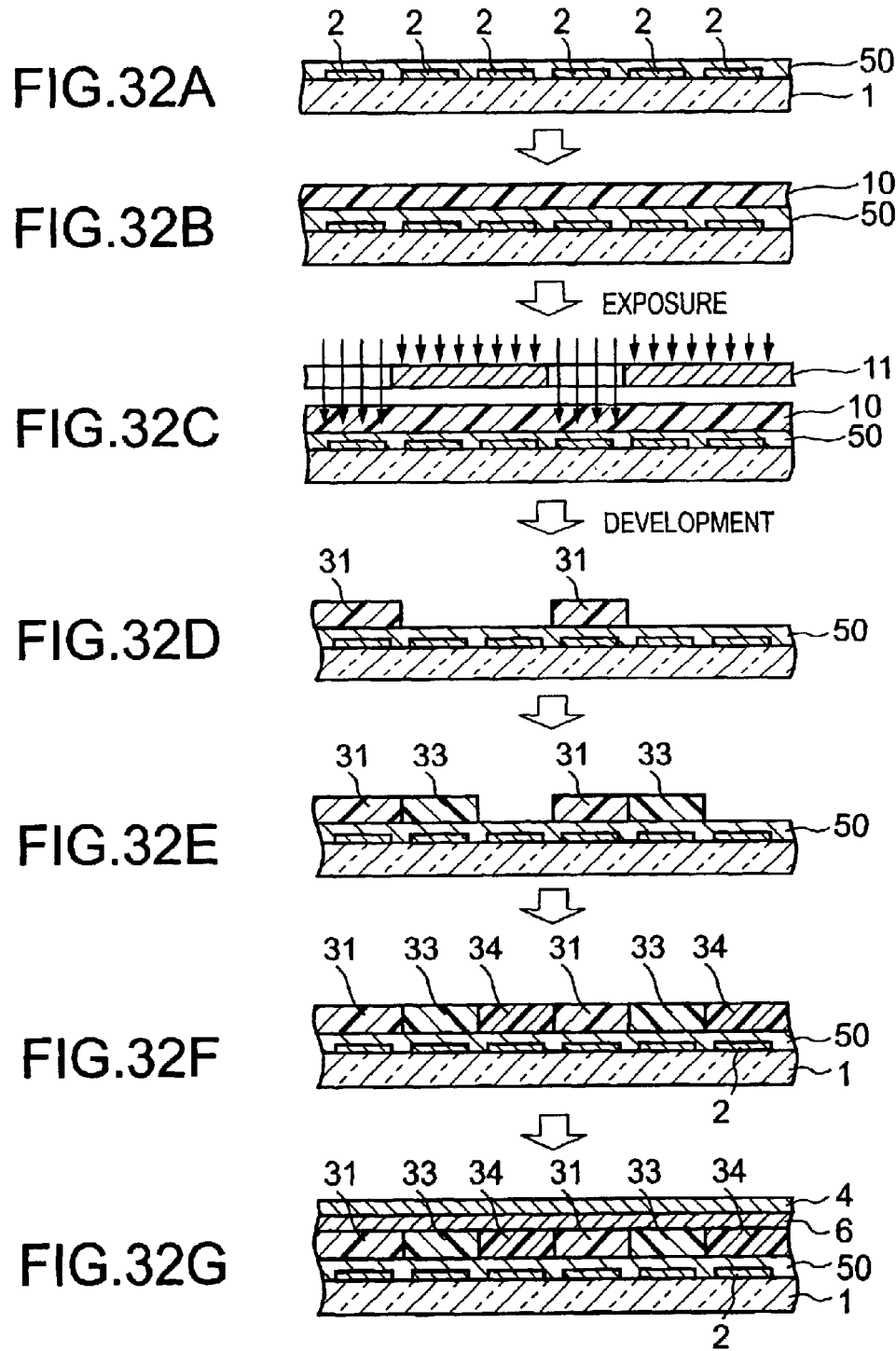

● ; PHOTOSENSITIVE GROUPS BONDED TO HIGH POLYMER

● ; PHOTOSENSITIVE GROUPS BONDED TO HIGH POLYMER

○ ; PHOTOSENSITIVE GROUPS BONDED TO LOW POLYMER

● ; PHOTOSENSITIVE GROUPS
   BONDED TO HIGH POLYMER

∞ ; FLUORESCENT COLORWG MATTER
   HAVING PHOTOSENSITIVE GROUPS

ORGANIC-ELECTROLUMINESCENCE DEVICE, PROCESS FOR ITS PRODUCTION AND ORGANIC-ELECTROLUMINESCENCE DISPLAY SYSTEM

This application is a Divisional application of Application No. 09/908,859, filed Jul. 20, 2001, now U.S. Pat. No. 6,696,181, the contents of which are incorporated herein by reference in their entirety.

This application is based on Japanese Patent Application No. 2000-165976 filed in Japan, the contents of which are incorporated hereinto by reference.

BACKGROUND OF THE INVENTION

This invention relates to an organic-electroluminescence (hereinafter often "organic-EL") device, a process for its production, and an organic-electroluminescence display system having the device.

In general, in notebook personal computers, PDAs (personal digital assistants), mobile computers, portable information terminals, cellular phones and so forth, liquid-crystal display is chiefly used as flat-panel display. Also, in recent years, the proportion of using liquid-crystal display in place of CRT (cathode ray tube) display is increasing in desktop computers, too.

However, the liquid-crystal display has problems such that it has insufficient response speed, requires a large power consumption in the case of backlighting systems, has a low luminance and contrast in the case of reflection systems and has inferior visual angle characteristics.

Flat-panel display substitutive of such liquid-crystal display may include PDP (plasma display panel) and FED (field emission display). These, however, also has problems that they require a large power consumption, can not be made thin and are heavy-weight.

Accordingly, as display that can solve these problems in liquid-crystal display and other flat-panel display such as PDP and FED at a stretch, organic-EL display is proposed (e.g., C. W. Tang et al., Appl. Phys. Lett., 51, 913, 1987). This organic-EL display has various superior characters such that it has a very higher response speed than the liquid-crystal display, has an excellent viewing angle due to displaying by self light emission, can be made thin by half as much as the liquid-crystal display because it has only one sheet as a necessary glass substrate and hence can be light-weight and may require a smaller power consumption than the backlighting-type liquid-crystal display. Accordingly, the organic-EL display is expected as a prospective means in the twenty-first century.

The organic-EL display uses, as luminescent devices, organic-EL devices making use of organic compounds as luminescent materials. The organic-EL devices have basic structure in which the anode, a photoemission layer and the cathode are superposed in this order on a substrate. A hole transport layer between the anode and the photoemission layer, and an electron transport layer between the cathode and the photoemission layer are optionally provided. Color display by such organic-EL devices include full-color display by three-primary-color dot matrixes, and multiple-color area color display. In either case, photoemission layers must be formed in prescribed patterns.

As methods for forming the photoemission layers for color display, the following methods (1) to (4) are known in the art.

(1) A method in which respective EL luminescent low-molecular materials for red, blue and green are separately mask-vacuum-deposited three times;

(2) a method in which organic-EL blue-light emission is converted into red color and green color by means of color conversion layers;

(3) a method in which solutions of respective EL luminescent high-molecular materials for red, blue and green are coated by ink-jet printing to coat three-primary-color materials separately; and (4) a method in which white-color EL light backlighting and color filters are used in combination.

However, the method (1) of mask vacuum deposition has so poor a productivity as to result in a high cost. Also, mask registration must be made inside a vacuum reactor, and it is difficult to achieve uniform film formation because of a difference in molecules' flying angle and distance between the middle area and the peripheral area of a substrate. In addition, there is a problem that any dusting inside the vacuum deposition reactor may cause film defects.

The method (2) of color conversion requires the color conversion layers other than organic-EL layers formed of EL luminescent high-molecular materials, and has a problem that many steps must be provided. In addition thereto, there is another problem that photoemission efficiency may lower because of a loss at the time of color conversion.

The method (3) of ink-jet coating requires dams for separating dots of EL luminescent high-molecular materials, and hence involves a low aperture percentage, resulting in a low effective luminance. Moreover, a long tact time is required because any whole-surface one-time coating can not be performed, resulting in a high cost especially in the case that large number of organic EL devices are produced in one lump substrate. There is also a problem on how to keep the quality of inks and printer heads.

The method (4) of using white EL light backlighting and color filters in combination has a disadvantage that the utilization efficiency of organic-EL light is so poor as to require a large power consumption.

Accordingly, as disclosed in Japanese Patent Application Laid-open No. 11-8069, a process for producing an organic-EL device making use of a photocurable acrylic resin is proposed. This process is a process in which a photosensitive resin composition prepared by adding an organic-EL material to a photocurable acrylic resin is coated on a substrate to form a film, followed by exposure via a mask having prescribed patterns and then development to form a photoemission layer and a hole transport layer and/or an electron transport layer in that prescribed patterns.

According to this process, the layers can be formed in patterns in a simple manner for each color of RGB (red, green and blue). The acrylic resin, however, may be affected by oxygen the atmosphere may contain at the time of curing, so that the surface may cure with difficulty. Especially in the production of organic-EL devices in which photoemission layers must be formed in thin films of about 100 nm thick, the rate of curing in air is so greatly low that the layers must be exposed in an inert atmosphere of argon, nitrogen or the like. This can be an obstacle to the achievement of mass production of devices. Also, since a liquid is used as the photosensitive material, a gap must be provided between the photosensitive material and the mask, and hence no precise exposure can be effected.

SUMMARY OF THE INVENTION

An object of the present invention is to provide an organic-EL device production process by which fine-pattern photoemission layers can be formed with ease and in a good precision, an organic-EL device which can be produced by that process, and an organic EL display system having that device.

To achieve the above object, the present invention provides a process for producing an organic-EL device; the process comprising the steps of:

forming a film of at least one of;

(a) a high-molecular compound composition which contains a high-molecular compound having a divalent organic group represented by the following Formula (7); and/or (b) a high-molecular compound composition which contains i) a high-molecular compound having a divalent organic group represented by the following Formula (8) and ii) a bisazide compound;

followed by exposure and then development to form a photoemission layer in a prescribed pattern.

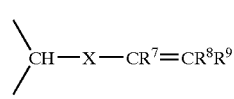
(7)

wherein X is a divalent organic group containing at least one of an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group and a carbonyl group; and $R^7$ to $R^9$ are each a hydrogen atom or a monovalent organic group containing at least one of an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group and a carbonyl group.

(8)

wherein W is a monovalent organic group containing at least one of an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group, a carbonyl group, a carbazole group and a fluorene group.

The present invention also provides an organic-EL device having a photoemission layer containing a high-molecular compound having been cross-linked with a divalent organic group represented by the following Formula (1) or (2), and an organic-EL display system having that organic-EL device. In the organic-EL device of the present invention, the photoemission layer may also have the function as a hole transport layer or an electron transport layer.

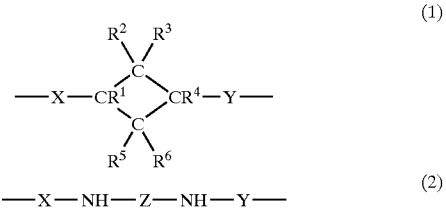

In the formulas, X, Y and Z are each a divalent organic group containing at least one of an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group and a carbonyl group. Also, $R^1$ to $R^6$ are each a hydrogen atom or a monovalent organic group containing at least one of an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group and a carbonyl group.

BRIEF DESCRIPTION OF THE DRAWINGS

These and other features, objects and advantages of the present invention will become more apparent from the following description when taken in conjunction with the accompanying drawings wherein:

FIGS. 32A to 32G illustrate a still further example of production steps for the organic-EL device of the present invention.

DESCRIPTION OF THE PREFERRED EMBODIMENTS

Figure 1:
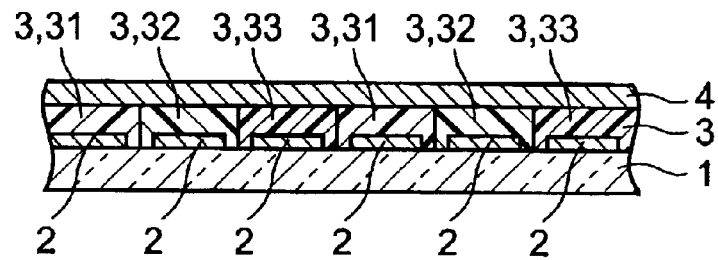
FIG. 1 is a partial cross-sectional view presented to describe an example of the structure of the organic-EL device of the present invention.

In the present invention, a film is formed using a material having already polymerized and standing as a high-molecular compound, and the film formed is exposed to cause it to undergo cross-linking to cure.

Hence, the film can be cured in air. Also, compositions used in the film formation have a moderate viscosity that fine patterns can be formed with ease and in a good precision.

A. Photosensitive Composition Before Photo-Crosslinking (a) High-Molecular Compound (Binder Polymer):

As to a high-molecular compound (binder polymer) having not been photo-crosslinked, there are no particular limitations on its backbone chain skeleton as long as it has a photo-crosslinkable group or is capable of being photo-crosslinked with a photo-crosslinking agent.

For example, polyvinyl resins, epoxy resins and phenolic resins may be used. There are also no particular limitations on its degree of polymerization as long as a thin film of about 10 to 200 nm thick can be formed. It may appropriately determined in accordance with necessary film properties and so forth, and may usually be from 10,000 to 2,000,000 as weight-average molecular weight.

It is desirable for the binder polymer to have at least one photo-crosslinkable group of a cinnamoyl group, a cinnamylidene group, a chalcone residual group, an isocoumarin residual group, a 2,5-dimethoxystilbene residual group, a thymine residual group, a styrylpyridinium residual group, an α-phenylmaleimide residual group, an anthracene residual group and a 2-pyrone residual group. For example, it may include those having repeating units as shown below. In the following, letter symbol n represents any desired integer.

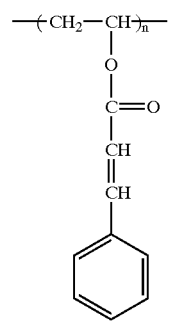

Photo-cross-linkable polymer containing cinnamoyl group (polyvinyl cinnamate)

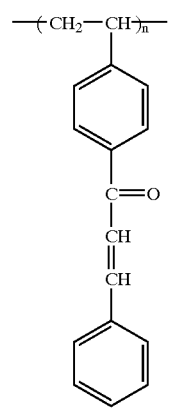

Photo-cross-linkable polymer containing chalcone group

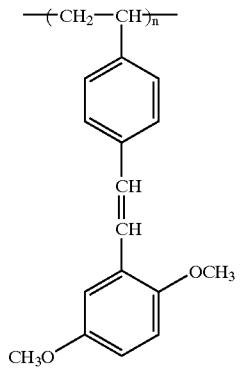

Photo-cross-linkable polymer containing 2,5-dimethoxystilbene residual group

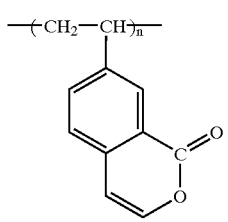

Photo-cross-linkable polymer containing isocoumarin residual group

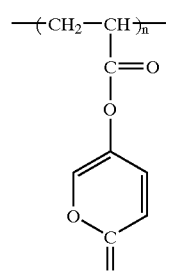

Photo-crosslinkable polymer containing pyrrone residual group

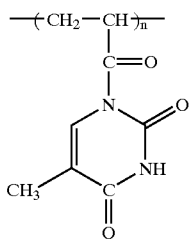

Photo-cross-linkable polymer containing thymine residual group

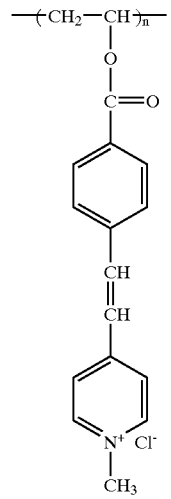

Photo-cross-linkable polymer containing styrylpyridinium residual group

-continued

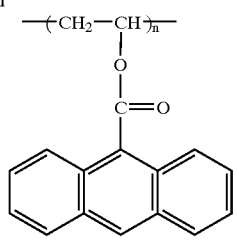

Photo-cross-linkable polymer containing anthracene residual group

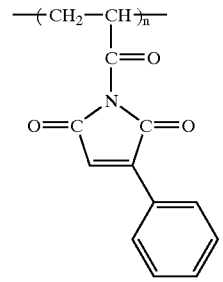

Photo-cross-linkable polymer containing α-phenyl-maleimide residual group

The binder polymer having such a photo-crosslinkable group may include, e.g., polyvinyl resins having a repeating unit represented by the following Formula (9). Thus, the binder polymer having a photo-crosslinkable group in the molecule is preferred because it is unnecessary to mix any additional photo-crosslinking agent.

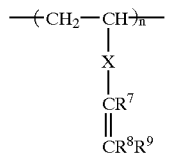 (9)

In Formula (9), X is a divalent organic group containing at least one of an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group and a carbonyl group; $R^7$ to $R^9$ are each a hydrogen atom or a monovalent organic group containing at least one of an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group and a carbonyl group; and n is an integer.

A binder polymer having a fluorescent group and/or a carrier transport group in the molecule is also preferred because it is unnecessary to mix any additional fluorescent agent or carrier-transporting agent. Such a functional binder polymer may include, e.g., photo-crosslinkable hole-transporting high polymers having a repeating unit represented by the following structural formulas, Formulas (10) to (12), and a photo-crosslinkable electron-transporting high polymer having a repeating unit represented by the following structural formula, Formula (13). Then, n is an integer.

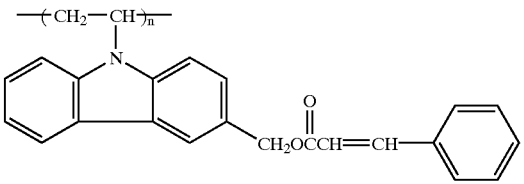 (10)

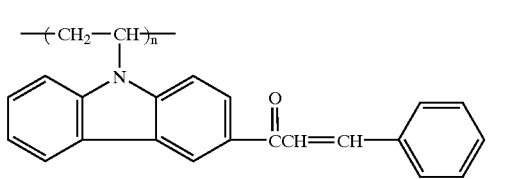 (11)

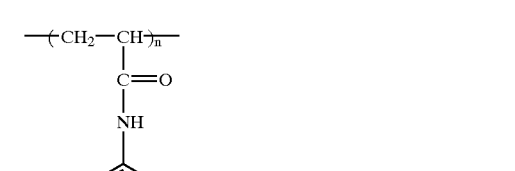 (12)

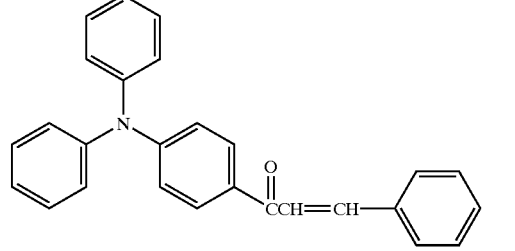

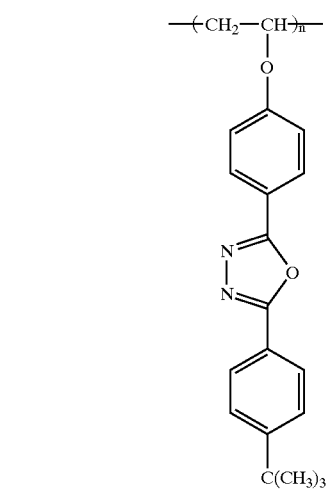 (13)

The binder polymer (having not been cross-linked) in the case when the photo-crosslinkable agent is used may preferably have an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group, a carbonyl group, a carbazole group and/or a fluorene group. Such a high-molecular compound may include polyvinyl resins represented by the following Formula (14).

(14)

In Formula (14), W is a monovalent organic group containing at least one of an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group, a carbonyl group, a carbazole group and a fluorene group. Also, n represents an integer.

(b) Photo-Crosslinking Agent:

Where the binder polymer does not have the above photo-crosslinkable group, it is desirable for the photosensitive composition to contain a photo-crosslinking agent. As the photo-crosslinking agent, an aromatic bisazide is preferred.

The photo-crosslinking agent may preferably be mixed in an amount of from 5 to 50 parts by weight, and particularly preferably from 10 to 30 parts by weight, based on 100 parts by weight of the binder polymer. If it is mixed in an amount less than 5 parts by weight, the photo-crosslinking reaction may proceed insufficiently. If it is in an amount more than 50 parts by weight, insufficient photoemission performance or carrier transport performance may result.

(c) Functional Material:

The photosensitive composition used in the present invention may be used to form any of photoemission layers, electron transport layers and hole transport layers.

Where the photosensitive composition is used to form photoemission layers, a fluorescent coloring matter is mixed in the composition. This fluorescent coloring matter may preferably be mixed in an amount of from 0.1 to 10 parts by weight, and particularly preferably from 0.5 to 4 parts by weight, based on 100 parts by weight of the binder polymer. If it is in an amount less than 0.1 part by weight, a low light emission intensity may result. If it is mixed in an amount more than 10 parts by weight, extinction ascribable to concentration may occur to also provide a low light emission intensity.

Where the photosensitive composition is used to form hole transport layers or electron transport layers and when the high-molecular compound itself has neither hole transport properties nor electron transport properties, a hole-transporting agent or an electron-transporting agent may be mixed in the composition, whereby such functions can be imparted to the layers. The hole-transporting agent or electron-transporting agent may preferably be mixed in an amount of from 5 to 120 parts by weight, and particularly preferably from 50 to 80 parts by weight, based on 100 parts by weight of the binder polymer. If it is mixed in an amount less than 5 parts by weight, the layer may have an insufficient carrier transport performance. If it is in an amount more than 120 parts by weight, the photosensitive composition may have insufficient film-forming properties.

(d) Photo-Crosslinking Initiator:

In order to cause cross-linking reaction in a good efficiency by light irradiation, a photo-crosslinking initiator may be mixed in the photosensitive composition. As this photo-crosslinking initiator, usable are, e.g., benzoin, benzoin ethers, Michler's ketone, azobutyronitrile and 8-chlorothioxanthone. Many photoradical generators used in usual photoresists are also usable as photo-crosslinking initiators.

The photo-crosslinking initiator may preferably be mixed in an amount of from 1 to 40 parts by weight, and particularly preferably from 5 to 20 parts by weight, based on 100 parts by weight of the binder polymer. If it is mixed in an amount less than 1 parts by weight, the photo-crosslinking reaction may proceed insufficiently. If it is in an amount more than 40 parts by weight, the layer may have an insufficient photoemission performance or carrier transport performance.

(e) Solvent:

There are no particular limitations on solvents as long as they are capable of dissolving respective components mixed in the photosensitive composition, such as the binder polymer having not been photo-crosslinked. Where the composition is coated by printing, preferred are N-methylpyrrolidone, γ-butyrolactone, dimethyl sulfoxide, dimethylformamide and mixed solvents of any of these, as having relatively high boiling points and superior dissolving power.

Based on 100 parts by weight of a solvent, the binder polymer may preferably be mixed in an amount of from 1 to 30 parts by weight. When films are formed by either method of spin coating and printing, it is difficult to form thin films if the binder polymer is mixed in an amount less than 1 part by weight. If it is in an amount more than 30 parts by weight, it is difficult to form thin films of 200 nm or smaller in thickness.

B. Curing Conditions

There are no particular limitations on a light source and wavelength used to effect photo-crosslinking. These may appropriately be so selected that the wavelength at which the photosensitive material used is photosensitive and the wavelength of the light source may come into agreement and the irradiation can be made in an amount of light that is necessary and sufficient for the required degree of curing.

As the light source used to effect photo-crosslinking, usable are, e.g., high-pressure mercury lamps, halogen lamps and metal halide lamps.

As to the amount of exposure light for the photo-crosslinking, the photo-crosslinking can usually be effected at 50 to 5,000 $mJ/cm^2$, and preferably at 500 to 3,000 $mJ/cm^2$. If the amount of exposure light is smaller than 50 $mJ/cm^2$, too small cross-link density may result. If the amount of exposure light is larger than 5,000 $mJ/cm^2$, side reaction such as reaction of fluorescent coloring matter with light may occur. Accordingly, it is desirable for its amount to be appropriately regulated in accordance with the types and concentrations of the photo-crosslinking agent, photo-crosslinking initiator and photo-crosslinkable group to be used.

C. High-Molecular Compound (Binder Polymer) After Photo-Crosslinking

As to a high-molecular compound (binder polymer) having been photo-crosslinked, there are no particular limitations on its backbone chain skeleton as long as it has been cross-linked with the photo-crosslinkable group or photo-crosslinking agent. For example, polyvinyl resins, epoxy resins and phenolic resins may be used. There are also no particular limitations on its degree of polymerization as long as a thin film of about 10 to 200 nm thick can be formed. It may appropriately be determined in accordance with necessary film properties and so forth.

For the high-molecular compound (binder polymer) contained in the photoemission layer of the present invention (and optionally the electron transport layer and/or the hole transport layer), it is desirable to have been cross-linked with at least one photo-crosslinkable group of a cinnamoyl group, a cinnamylidene group, a chalcone residual group, an iso-coumarin residual group, a 2,5-dimethoxystilbene residual group, a thymine residual group, a styrylpyridinium residual group, an α-phenylmaleimide residual group, an anthracene residual group and a 2-pyrrone residual group, or have been cross-linked with the photo-crosslinking agent (preferably an aromatic bisazide).

Such a binder polymer may include, e.g., polyvinyl resins having a repeating unit represented by the following Formula (15) or (16).

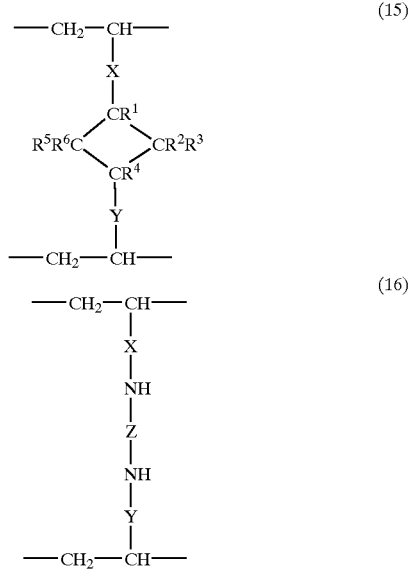

In the formula, X, Y and Z are each a divalent organic group containing at least one of an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group and a carbonyl group. Also, $R^1$ to $R^6$ are each a hydrogen atom or a monovalent organic group containing at least one of an allyl group (preferably having 2 to 10 carbon atoms), an aryl group (e.g., a benzene ring residual group such as a phenyl group or a phenylene group), an alkylene group (preferably having 1 to 10 carbon atoms), an alkyl group (preferably having 1 to 10 carbon atoms), an amide group, an ester group, a nitrile group and a carbonyl group. Also, n represents an integer.

Figure 36:
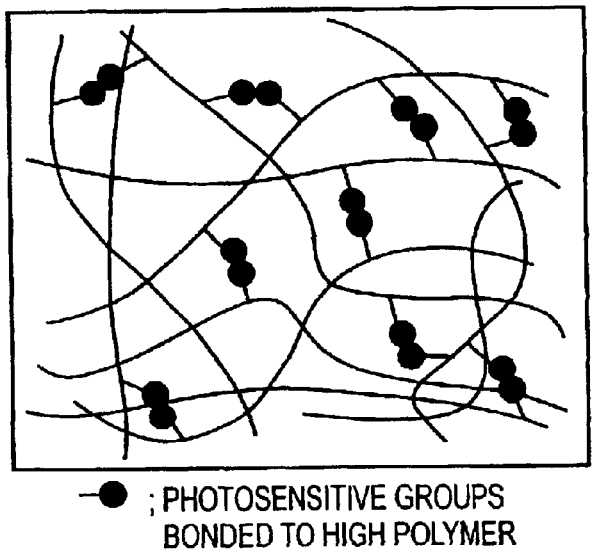
FIG. 36 is a diagrammatic view showing a high polymer cross-linked with photosensitive groups.

As examples of the binder polymer used in the present invention, it may include, e.g., cross-linked polymers obtained by photo-crosslinking any of polyvinyl carbazole type, polyalkylfluorene type, polytriphenylamine type, soluble polyphenylenevinylene type, triazole type and oxathiazole type high polymers each having a photosensitive group such as an azido group, a cinnamoyl group, a cinnamylidene group, an acrylic group, a methacrylic group or a chalcone group, as shown in FIG. 36, via this photosensitive group.

Figure 37:
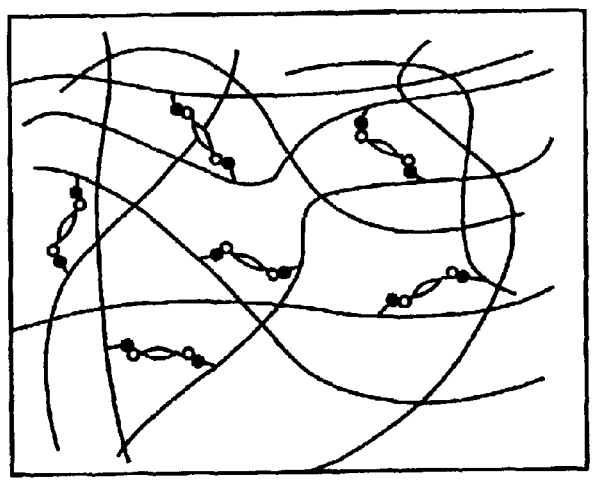
FIG. 37 is a diagrammatic view showing a high polymer and a low polymer both cross-linked with photosensitive groups.

In the present invention, as the binder polymer, a high polymer may also be used which is obtained by, as shown in FIG. 37, photo-crosslinking a low polymer having the above-exemplified photosensitive group in plurality, with a high polymer having the photosensitive group in plurality.

Figure 38:
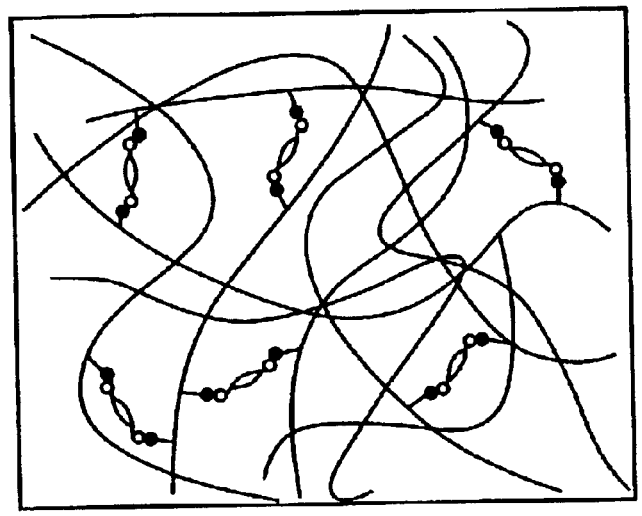
FIG. 38 is a diagrammatic view showing a high polymer cross-linked with photosensitive groups, and fluorescent coloring matters.

A high polymer obtained by, as shown in FIG. 38, photo-crosslinking a fluorescent coloring matter having the above-exemplified photosensitive group in plurality, with a high polymer having the photosensitive group in plurality may still also be used to form the photoemission layer.

In these materials, the linear high polymer cross-links upon irradiation by light to form networks, and become insoluble in solvents.

D. Photoemission Layers

In the organic-EL device of the present invention, at least a part of photoemission layers comprises a cured product of the photosensitive composition. More specifically, where the photoemission layers comprise blue-color photoemission layers (in a pattern) comprised of a blue-color luminescent material, red-color photoemission layers (in a pattern) comprised of a red-color luminescent material and green-color photoemission layers (in a pattern) comprised of a green-color luminescent material, at least one of the blue-color luminescent material, the red-color luminescent material and the green-color luminescent material contains the high-molecular compound having been photo-crosslinked with the organic group of Formula (1) or (2). Here, the photoemission layers (or a part thereof) may be so made as to serve also as at least one of the electron transport layer(s) and the hole transport layer(s). In the present invention, a photoemissive hole transport layer and a photoemissive electron transport layer are also included in the photoemission layers.

In the case when the photoemission layers are endowed with hole transport properties, a hole-transporting high-polymeric material or low-polymeric material may be added. In the case when the photoemission layers are endowed with electron transport properties, an electron-transporting high-polymeric material or low-polymeric material may be added. The low-polymeric material is incorporated into the networks of the high polymer having been photo-crosslinked, and hence does not dissolve easily in the subsequent steps. A high polymer may also be used which has a functional group having hole transport properties or electron transport properties in the molecule.

In order to improve photoemission efficiency and photoemission colors, the photoemission layers may be doped with a fluorescent coloring matter. As a method for the doping with a fluorescent coloring matter, a coloring matter having a photosensitive group as a substituent may be used. Alternatively, a coloring matter having no photosensitive group may merely be mixed in the photosensitive composition described above. Even when thus merely mixed, the fluorescent coloring matter the layers have been doped with is incorporated into the networks of the high polymer having been photo-crosslinked, and hence does not dissolve easily in the subsequent steps. As examples of such dopant fluorescent coloring matter, it may include coumarin-type coloring matters, styryl-type coloring matters, merocyanine-type coloring matters, oxonol-type coloring matters, Nile Red, rubrene and perylene.

In the organic-EL device of the present invention, the device may also be so constructed that a hole transport layer containing a first-color (e.g., blue-color) luminescent material is further provided and the photoemission layers comprise i) a hole block pattern comprised of a hole-blocking material which inhibits the transport of holes, ii) a first photoemission pattern comprised of a second-color (e.g., red-color) luminescent material and iii) a second photoemission pattern comprised of a third-color (e.g., green-color) luminescent material. In this case, at least one of the hole-blocking material, the second-color luminescent material and the third-color luminescent material contains the high-molecular compound having been photo-crosslinked with the organic group of Formula (1) or (2). Here, at least one of the first photoemission pattern and the second photoemission pattern may be so made as to serve also as the electron transport layer.

As materials for the first-color (e.g., blue-color) photoemissive hole transport layer, luminescent materials having a large band gap may be used, such as cross-linked polyvinyl carbazole, polyalkylfluorene and polytriphenylamine. Also, a hole-transporting low-molecular material and a blue-color luminescent low-molecular material may be used in combination in the photosensitive composition. These mixed low-molecular materials are incorporated into the networks of the cross-linked polymer having been photo-crosslinked, and hence do not dissolve easily in the subsequent steps.

To form the hole block layer, a cross-linkable high polymer to which molecules capable of exhibiting hole block performance have been bonded may be used, or molecules capable of exhibiting hole block performance may be mixed in the cross-linkable high polymer.

The organic-EL device of the present invention may preferably have a hole transport layer containing a high polymer cross-linked with the divalent organic group represented by the above Formula (1), provided that X and Y are each a divalent organic group represented by any of the following structural formulas, Formulas (3) to (5):

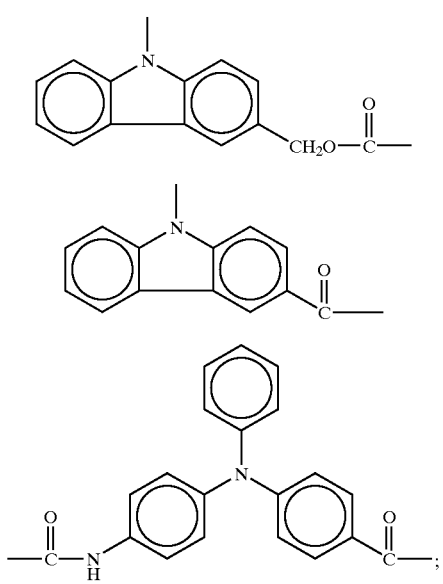

$R^1$, $R^2$, $R^4$ and $R^5$ are each a hydrogen atom; and $R^3$ and $R^6$ are each a phenyl group.

This high-molecular compound has both the photo-curability and the hole transport properties, and hence, especially when at least a part of the photoemission layers has also the hole transport properties, the compound is preferable for the formation of photoemission layers having the hole transport properties (serving also the hole transport layer).

The organic-EL device of the present invention may also preferably have an electron transport layer containing a high polymer cross-linked with the divalent organic group represented by the above Formula (1), provided that X and Y are each a divalent organic group represented by the following structural formula, Formula (6):

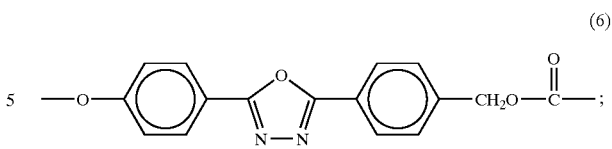

$R^1$, $R^22$, $R^4$ and $R^5$ are each a hydrogen atom; and $R^3$ and $R^6$ are each a phenyl group.

This high-molecular compound has both the photo-curability and the electron transport properties, and hence, especially when at least a part of the photoemission layers has also the electron transport properties, the compound is preferable for the formation of photoemission layers having the electron transport properties (serving also the electron transport layer).

E. Organic-EL Device

In the organic-EL device of the present invention, at least the photoemission layer(s) comprise(s) a cured product of the photosensitive composition. In addition to the photoemission layer(s), one or both of the electron transport layer and the hole transport layer may comprise a cured product of the photosensitive composition.

An example of the structure of the organic-EL device of the present invention is shown in FIG. 1. FIG. 1 is a partial illustration of a structural cross section. As structure of the simplest organic-EL device, photoemission layers 3 are formed on anodes 2 comprised of transparent conductive films formed on a glass substrate 1, and a cathode 4 comprised of, e.g., a magnesium-silver alloy or an aluminum-lithium alloy is further formed thereon. In this case, the photoemission layers 3 have both the property of transporting holes injected from the anodes 2 and the property of transporting electrons injected from the cathode. The holes and electrons injected recombine in photoemissive molecules in the interior of the photoemission layers 3, and fluorescent light is emitted in that course.

Figure 2:
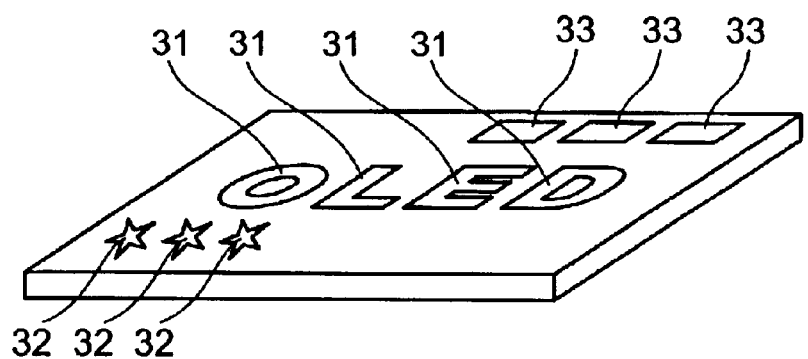
FIG. 2 is a perspective view presented to describe an example of the organic-EL device of the present invention.

In an RGB full-color display device, the photoemission layers 3 are, as shown in FIG. 1, constituted of red-color photoemission layers 31, blue-color photoemission layers 32 and green-color photoemission layers 33. Also, in a multiple-color area color display device, the respective photoemission layers 31 to 33 are formed in patterns as shown in FIG. 2, for individual areas of logotypes and icons. In the present invention, these photoemission layers 31 to 33 may be constituted of the photo-crosslinked high polymer or the the composition containing the photo-crosslinked high polymer, whereby fine patterning can be made with ease.

Figure 3:
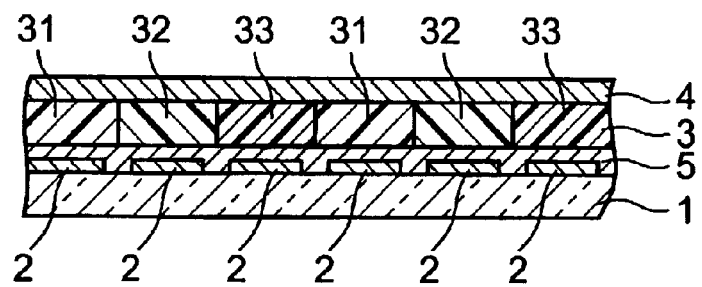
FIG. 3 is a partial cross-sectional view showing another example of the structure of the organic-EL device of the present invention.

Another example of the structure of the organic-EL device of the present invention is shown in FIG. 3. In this example of structure, photoemission layers 3 and a hole transport layer 5 stand functionally separate from each other to provide an organic double-layer structure.

More specifically, the hole transport layer 5 is provided between the photoemission layers 3 and anodes 2. In this structure, the photoemission layers 3 has both the photoemission properties and the electron transport properties, but need not necessarily have the property of transporting holes. The holes injected from the anodes 2 reach the photoemission layers 3 through the hole transport layer 5. The electrons injected from the cathode 4 are transported through the interior of the photoemission layers 3. Thus, the holes and electrons injected recombine in the interior of the photoemission layers 3, and the energy thus produced causes photoemission. Incidentally, the hole transport layer 5, which is also an underlying layer of the photoemission layers 3, is formed using a material containing a high polymer insoluble in a solvent for a material solution used when the photoemission layers 3 are formed.

Such a high polymer may preferably be a cured product of a cross-linkable high polymer, like the cured product of the photosensitive composition used in the present invention, but a material containing an uncrosslinkable, solvent-insoluble high polymer may also be used.

Figure 4:
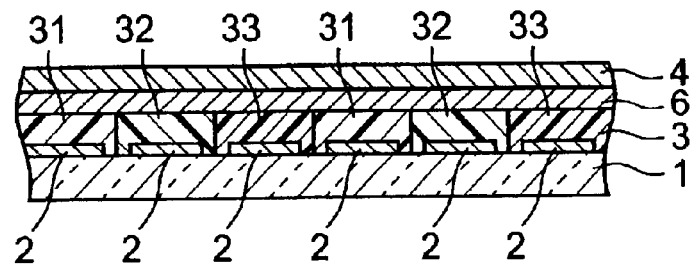
FIG. 4 is a partial cross-sectional view showing still another example of the structure of the organic-EL device of the present invention.

Still another example of the structure of the organic-EL device of the present invention is shown in FIG. 4. In this example of structure, photoemission layers 3 and an electron transport layer 6 stand functionally separate from each other to provide an organic double-layer structure. More specifically, the electron transport layer 6 is provided between the photoemission layers 3 and the cathode 4. In this structure, the photoemission layers 3 has both the photoemission properties and the hole transport properties, but need not necessarily have the property of transporting electrons. The electrons injected from the cathode 4 are transported to the photoemission layers 3 through the electron transport layer 6. The holes injected from the anodes 2 are transported through the interior of the photoemission layers 3. Thus, the holes and electrons recombine in the interior of the photoemission layers 3, and the energy thus produced causes photoemission. The electron transport layer 6 may be formed using any of a low-molecular compound, an uncrosslinkable polymer and a cross-linkable polymer, but it is better to use a cross-linked polymer like the cured product of the photosensitive composition used in the present invention. This is preferable because electron transport layer materials can have a high glass transition temperature (Tg) and the device can be improved in long-term operation stability.

Thus, such function-separated structure in which the photoemission layers 3 and the hole transport layer 5 or electron transport layer 6 stand functionally separate enables a more improvement in photoemission efficiency.

Figure 5:
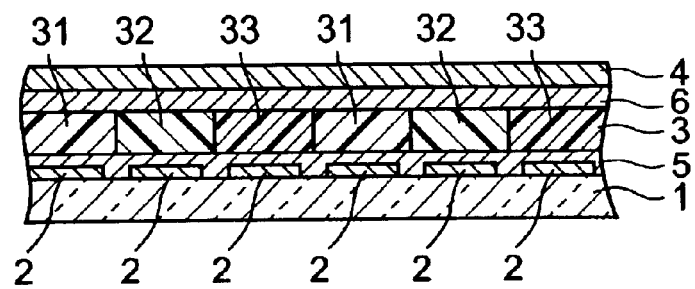
FIG. 5 is a partial cross-sectional view showing a further example of the structure of the organic-EL device of the present invention.

A further example of the structure of the organic-EL device of the present invention is shown in FIG. 5. In this example of structure, photoemission layers 3, a hole transport layer 5 and an electron transport layer 6 stand functionally separate from one another to provide an organic triple-layer structure. More specifically, a substrate 1, anodes 2, a hole transport layer 5, photoemission layers 3, an electron transport layer 6, a cathode 4 are superposed in this order. In this structure, the hole mobility and electron mobility in the photoemission layers 3 need not necessarily be so much larger than those in the corresponding transport layers.

Thus, such function-separated structure in which the photoemission layers 3, and hole transport layer 5 and/or electron transport layer 6 stand functionally separate enables a more improvement in photoemission efficiency.

Figure 6:
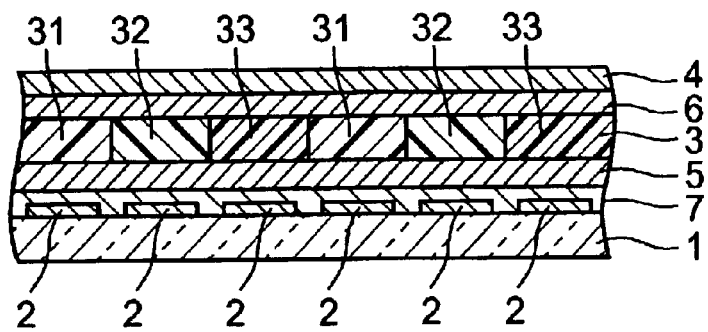
FIG. 6 is a partial cross-sectional view showing a still further example of the structure of the organic-EL device of the present invention.
Figure 7:
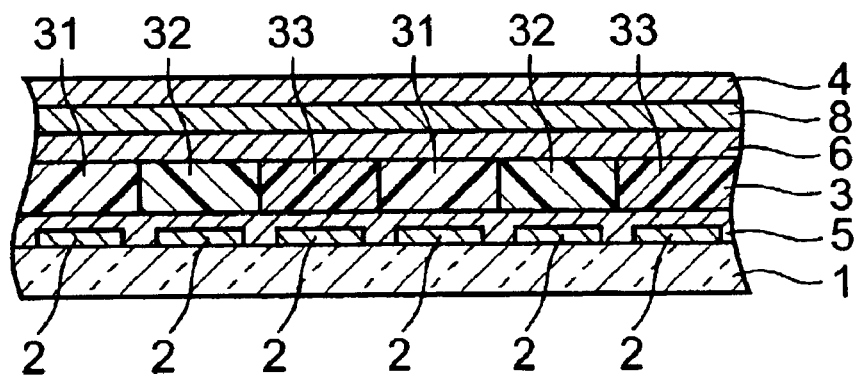
FIG. 7 is a partial cross-sectional view showing a still further example of the structure of the organic-EL device of the present invention.
Figure 8:
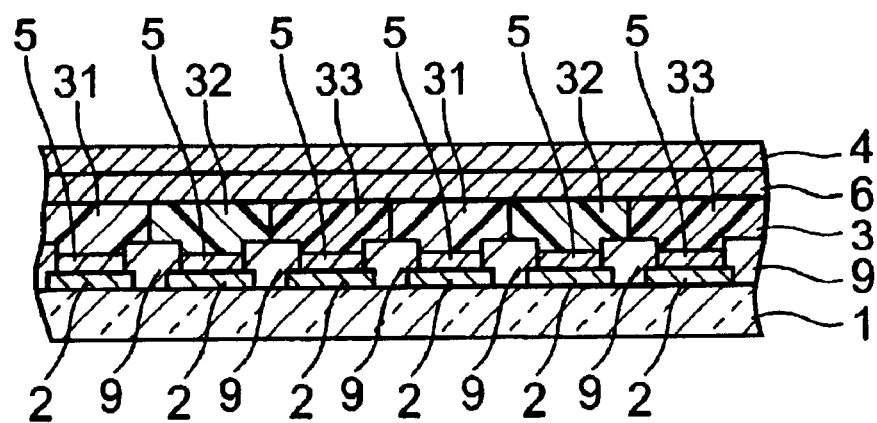
FIG. 8 is a partial cross-sectional view showing a still further example of the structure of the organic-EL device of the present invention.

The organic-EL device of the present invention may also be provided with, as shown in FIG. 6, a hole injection layer 7 between the anodes 2 and the hole transport layer 5 so that the efficiency of hole injection from the anodes 2 can be improved. The organic-EL device of the present invention may be provided with, as shown in FIG. 7, a buffer layer 8 between the cathode 4 and the electron transport layer 6, or may be provided with, as shown in FIG. 8, insulators 9 to separate adjoining dots electrically so that any electric-current leak can be prevented from occurring between the adjoining dots.

Figure 9:
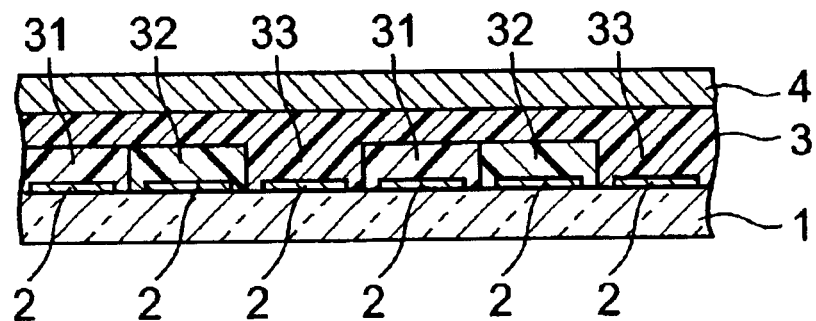
FIG. 9 is a partial cross-sectional view showing a still further example of the structure of the organic-EL device of the present invention.

As in a full-color display device of an RGB three-primary-color dot matrix type shown in FIG. 9, the device may also be constructed in such a way that red-color photoemission layers 31 are so provided as to respectively cover anodes 2 in respect of ⅓ (one third) among the anodes 2 to form red pixels, blue-color photoemission layers 32 are so provided as to respectively cover anodes 2 in respect of other ⅓ among the anodes 2 to form blue pixels, and green-color photoemission layers 33 are so provided as to respectively cover anodes 2 in respect of the remaining ⅓ among the anodes 2 to form green pixels at the areas not covered with the photoemission layers 31 and 32. Incidentally, photoemission colors of the photoemission layers 31 to 33 are by no means limited to those shown here, and any desired colors may be selected from among the three colors RGB.

In this example, the photoemission layer (green-color photoemission layers) 33 which covers the respective photoemission layers 31 and 32 need not necessarily be formed of the material containing the photo-crosslinked polymer. The photoemission layer 33 has the property of electroluminescence and at the same time the property of transporting holes and electrons. The photoemission layers 31 and 32 each have the property of electroluminescence and at the same time the property of transporting holes, but need not necessarily have the property of transporting electrons. However, it is better for these layers 31 and 32 also to have electron transport properties.

Into the photoemission layers 31 and 32, electrons are injected through the photoemission layer 33. The holes and electrons injected recombine in molecules in the interior of the photoemission layers 3. In that course, fluorescent light is emitted. Compared with the construction shown in FIG. 1, the construction shown in FIG. 9 has an advantage that it is unnecessary to form the photoemission layer 33 in a pattern and hence the production steps can be fewer.

In the area color display device, the photoemission colors need not be the RGB three primary colors. For example, pixels may be formed in five colors. In such a case, too, like the case shown in FIG. 9, only four color photoemission layers may be formed in patterns and the remaining one color photoemission layer may be formed over the whole display area. This enables formation of pixels in many colors through a smaller number of steps.

Figure 10:
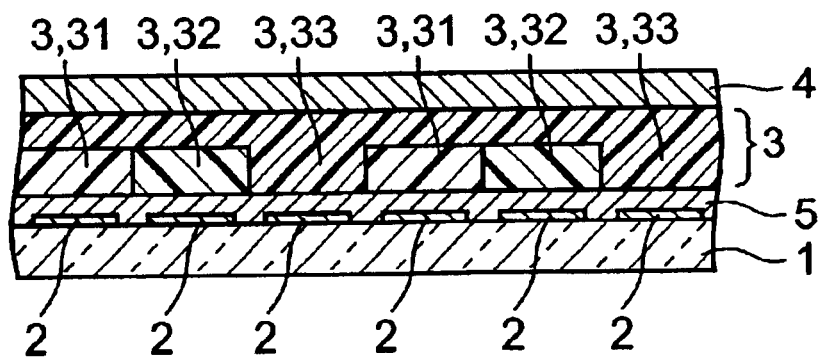
FIG. 10 is a partial cross-sectional view showing a still further example of the structure of the organic-EL device of the present invention.
Figure 11:
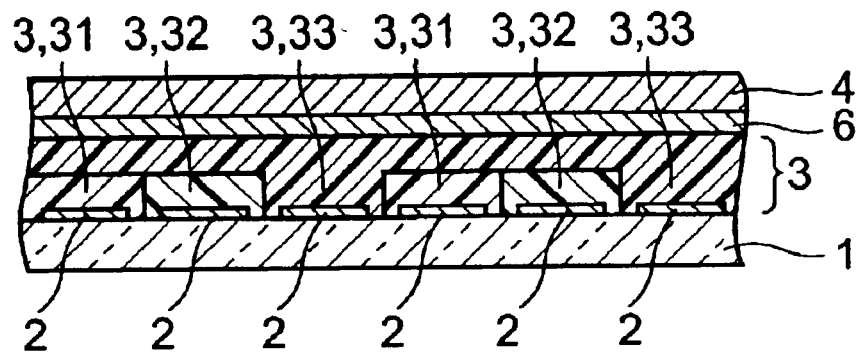
FIG. 11 is a partial cross-sectional view showing a still further example of the structure of the organic-EL device of the present invention.
Figure 12:
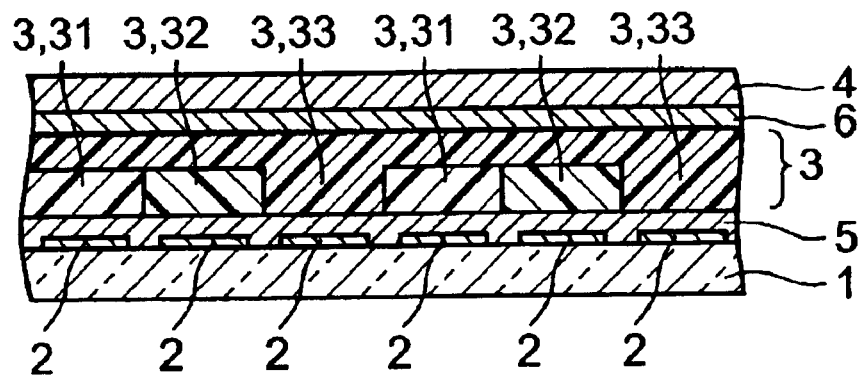
FIG. 12 is a partial cross-sectional view showing a still further example of the structure of the organic-EL device of the present invention.
Figure 13:
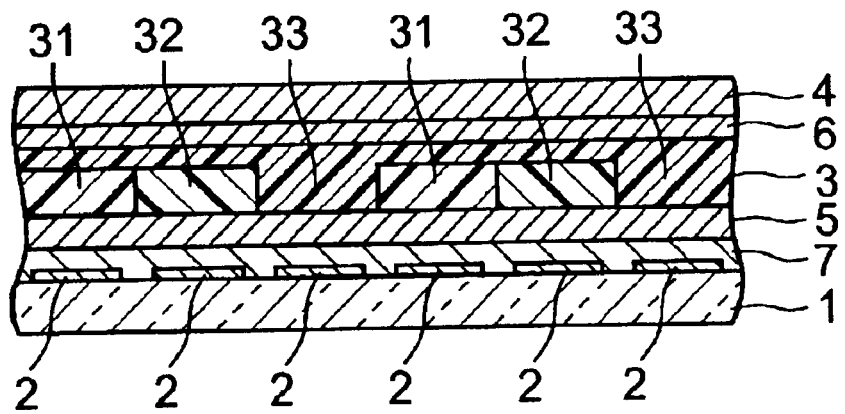
FIG. 13 is a partial cross-sectional view showing a still further example of the structure of the organic-EL device of the present invention.
Figure 14:
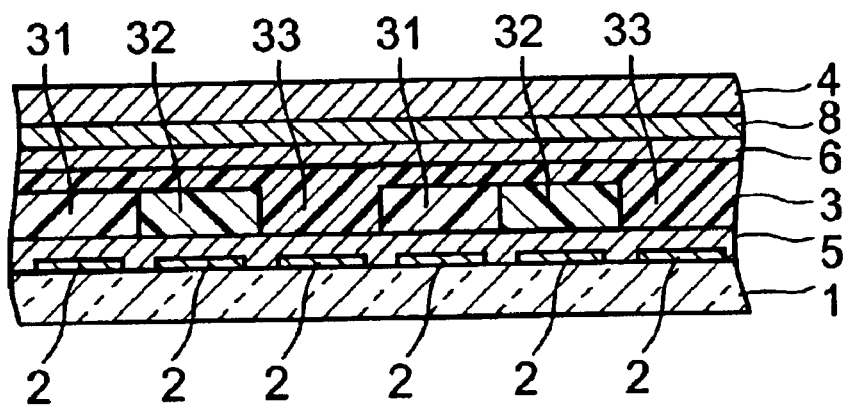
FIG. 14 is a partial cross-sectional view showing a still further example of the structure of the organic-EL device of the present invention.
Figure 15:
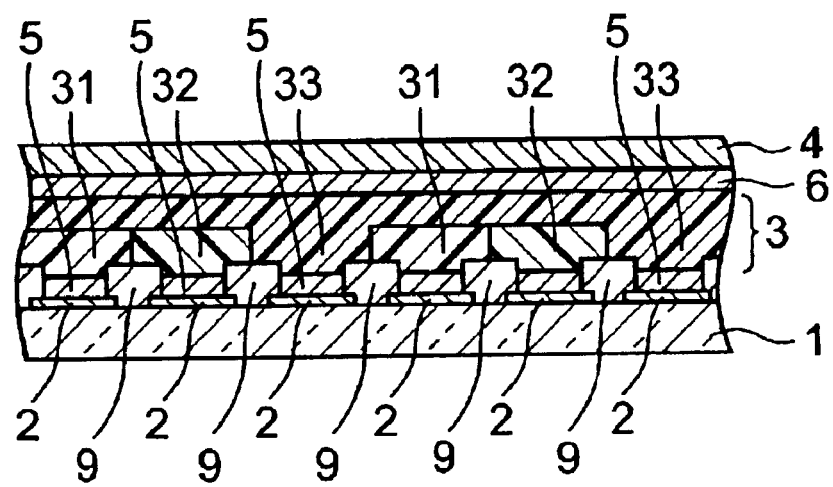
FIG. 15 is a partial cross-sectional view showing a still further example of the structure of the organic-EL device of the present invention.

In the case when one photoemission layer 33 is so formed over the whole as to cover other photoemission layers 31 and 32 in this way, like the case described above, a hole transport layer 5 may also be provided between the photoemission layers 3 and the anodes 2 as shown in FIGS. 10 and 12, or an electron transport layer 6 may be provided between the photoemission layers 3 and the cathode 4 as shown in FIGS. 11 and 12. Also, as shown in FIG. 13, a hole injection layer 7 may be provided between the anodes 2 and the hole transport layer 5, and, as shown in FIG. 14, a buffer layer 8 may be provided between the cathode 4 and the electron transport layer 6. Still also, as shown in FIG. 15, insulators 9 may be provided between adjoining pixels.

Figure 16:
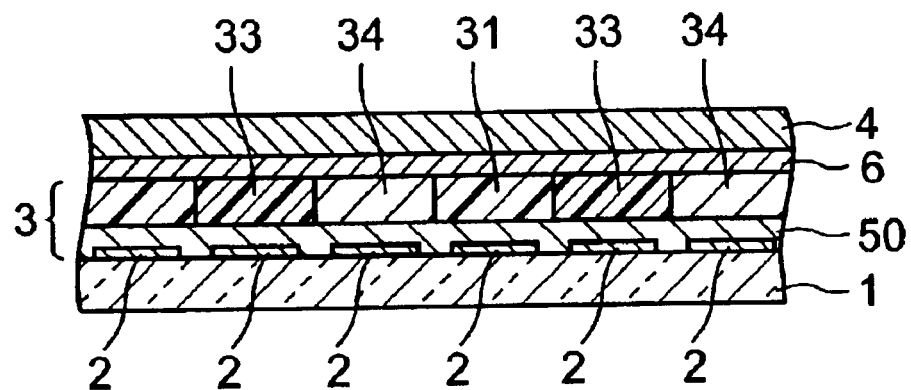
FIG. 16 is a partial cross-sectional view showing a still further example of the structure of the organic-EL device of the present invention.

As in a full-color display device of an RGB three-primary-color dot matrix type shown in FIG. 16, the device may also be constructed in such a way that a blue-color photoemissive hole transport layer 50 is so provided as to cover the anodes 2 and that red-color photoemission layers 31, green-color photoemission layers 33 and hole block layers 34 are provided on the surface of this blue-color photoemissive hole transport layer 50 at its positions corresponding to the anodes 2. Like the case of FIGS. 1 and 9 as described above, this construction is applicable not only to the full-color display device of an RGB three-primary-color dot matrix type but also to the multiple-color area color display device.

In the present organic-EL device, the holes injected from the anodes 2 are injected into the red-color photoemission layers 31 and green-color photoemission layers 33 through the blue-color photoemissive hole transport layer 50, and recombine with electrons in photoemission atomic groups in the interior of the photoemission layers 31 and 33. In that course, red-color light and green-color light are emitted.

Figure 17:
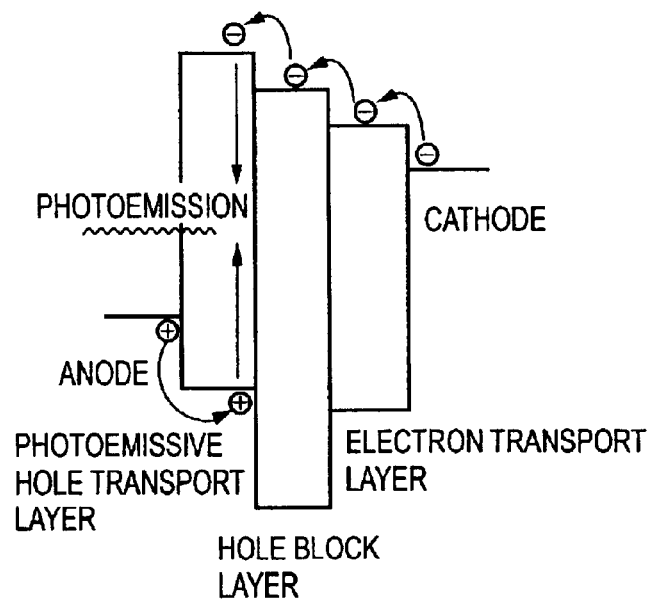
FIG. 17 illustrates the function of a hole block layer.

In contrast thereto, the emission of blue-color takes place in the blue-color photoemissive hole transport layer 50. As shown in FIG. 17, the holes injected from the anodes 2 are transported through the blue-color photoemissive hole transport layer 50 up to the vicinity of the interface between it and each hole block layer 34. However, the hole block layer 34 has so great an ionization potential that the holes are by no means injected into the hole block layer 34. On the other hand, the electrons injected from the cathode 4 are injected into the blue-color photoemissive hole transport layer 50 through the electron transport layer 6 and the hole block layer 34. The hole-electron recombination takes place in the interior of the blue-color photoemissive hole transport layer 50, and blue-color light is emitted.

Figure 18:
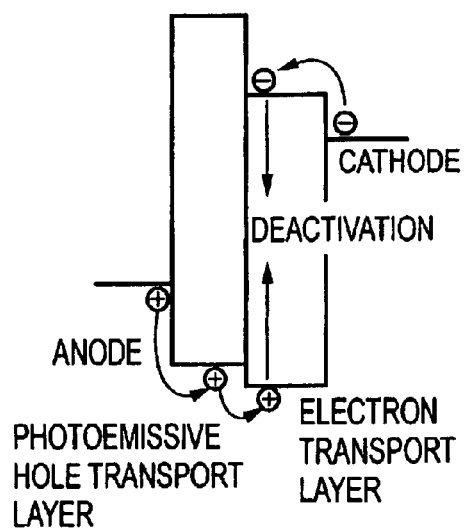
FIG. 18 illustrates the function of a photoemissive hole transport layer.

Here, in order for the hole block layers 34 to function in this way, the layer must have an ionization potential of 6.0 eV or higher. If the hole block layers 34 are not provided, as shown in FIG. 18 the holes injected from the anodes 2 are injected into the electron transport layer 6 through the blue-color photoemissive hole transport layer 50, but deactivate in the vicinity of the interface between them to become heat energy, because there is no photoemissive atomic group in the electron transport layer 6.

The hole block layers 34 may be formed using a material containing a phenanthrorine material represented by the following Formula (17).

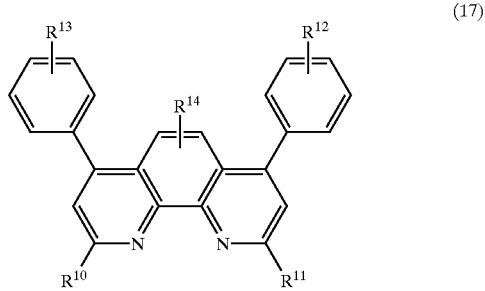

(17)

In the formula, $R^{10}$ to $R^{14}$ are each an alkyl group, alkenyl group or alkoxyl group which is unsubstituted or has a substituent such as a cyano group, a hydroxyl group, a nitro group, an amino group or a dimethylamino group. Such molecules have a feature that they have a greater ionization potential than the blue-color photoemissive hole transport layer 50, thus the transport of holes is shut out here (FIG. 17).

In the present invention, at least one of the red-color photoemission layers 31, the green-color photoemission layers 33 and the hole block layers 34 is comprised of a cured product of the photosensitive composition described above, and all of them may preferably be comprised of such a cured product. Also, in this example, the blue-color photoemissive hole transport layer 50 serves as both a blue-color photoemission layer and a hole transport layer. However, any of red-color and green-color photoemission layers may be so formed as to serve also as the hole transport layer.

Figure 19:
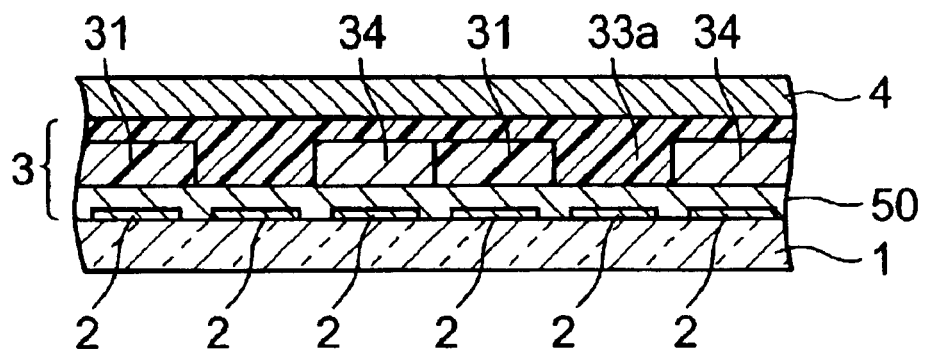
FIG. 19 is a partial cross-sectional view showing a still further example of the structure of the organic-EL device of the present invention.
Figure 20:
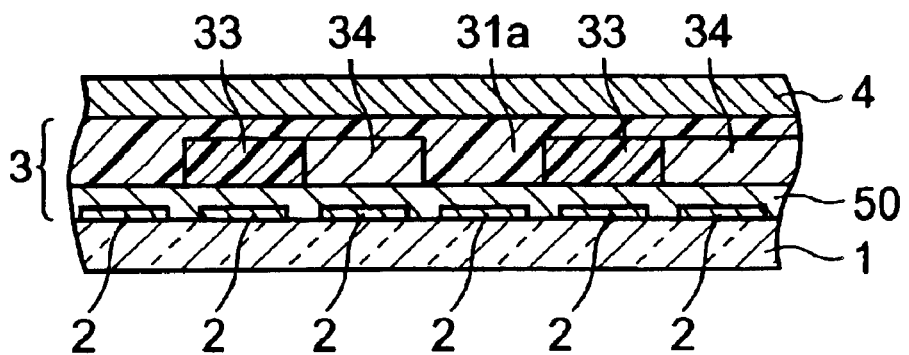
FIG. 20 is a partial cross-sectional view showing a still further example of the structure of the organic-EL device of the present invention.
Figure 21:
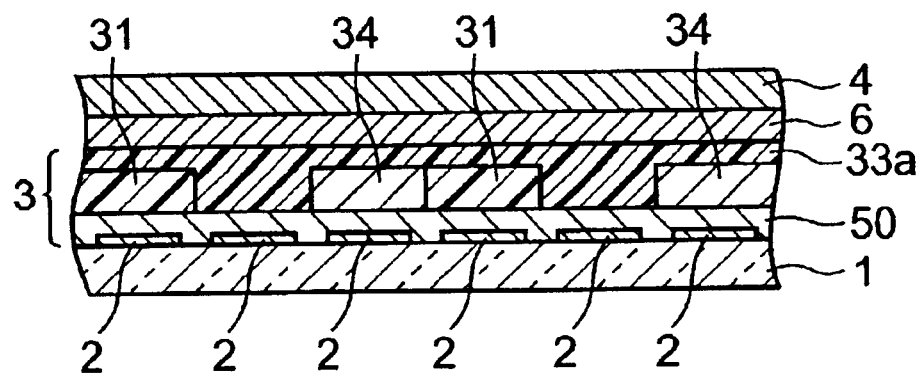
FIG. 21 is a partial cross-sectional view showing a still further example of the structure of the organic-EL device of the present invention.
Figure 22:
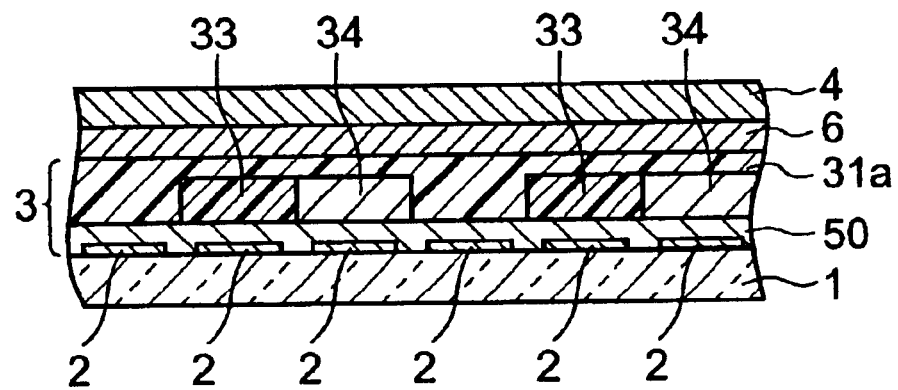
FIG. 22 is a partial cross-sectional view showing a still further example of the structure of the organic-EL device of the present invention.

In the construction in which the hole block layers 34 are used, too, like the case shown in FIG. 12, the photoemission layers 31 and the hole block layers 34 may be so provided that each of them covers each corresponding anode 2, and a green-color photoemission layer 33a having electron transport properties may be so formed over the whole blue-color photoemissive hole transport layer 50 as to cover the red-color photoemission layers 31 and the hole block layers 34 (FIG. 19). With such construction, compared with the example shown in FIG. 16, it is unnecessary to form the green-color photoemission layers 33 in a pattern and hence the number of production steps can be cut down. Also, as shown in FIG. 20, a red-color photoemission layer 31a having electron transport properties may be so formed over the whole blue-color photoemissive hole transport layer 50 as to cover green-color photoemission layers 33 and hole block layers 34. Still also, the electron transport layer 6 may be provided between such an electron-transporting photoemission layer 31a or 33a and the cathode 4 (FIGS. 21 and 22).

Figure 23:
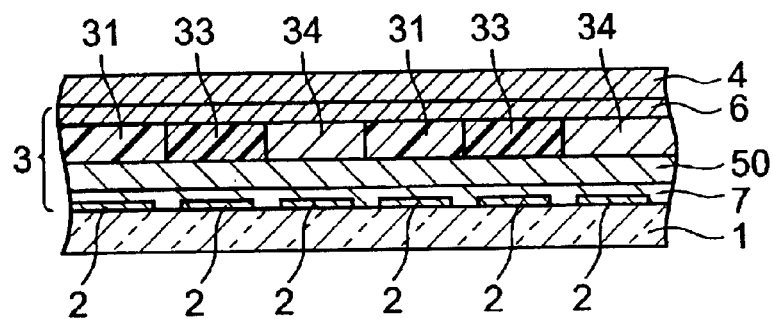
FIG. 23 is a partial cross-sectional view showing a still further example of the structure of the organic-EL device of the present invention.
Figure 24:
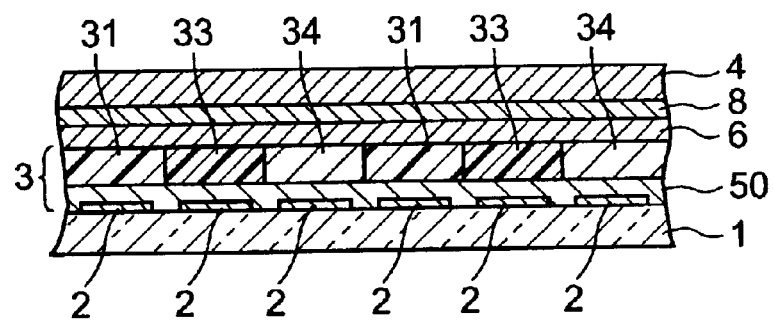
FIG. 24 is a partial cross-sectional view showing a still further example of the structure of the organic-EL device of the present invention.
Figure 25:
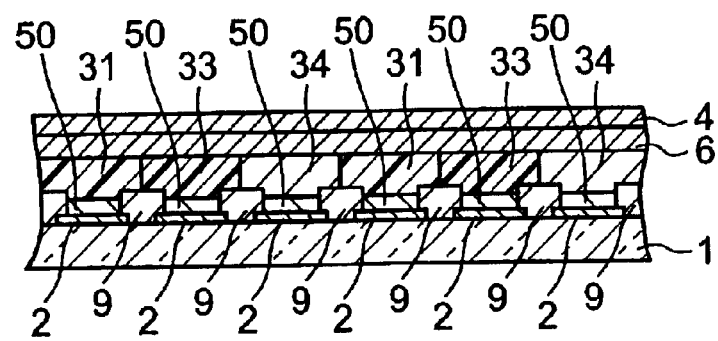
FIG. 25 is a partial cross-sectional view showing a still further example of the structure of the organic-EL device of the present invention.

In the construction in which the hole block layers 34 are provided, too, like the examples shown in FIGS. 1 and 9, a hole injection layer 7 may be provided between the anodes 2 and the blue-color photoemissive hole transport layer 50 as shown in FIG. 23, and, as shown in FIG. 24, a buffer layer 8 may be provided between the cathode 4 and the electron transport layer 6. Still also, as shown in FIG. 25, insulators 9 may be provided between adjoining pixels.

F. Organic-EL Device Production Process

In the production process of the present invention, the photoemission layers are formed using the photosensitive composition.

The hole transport layer and/or the electron transport layer may also be formed using the photosensitive composition. When these layers are formed using the photosensitive composition, films (wet coatings) of the photosensitive composition are first formed (by coating or the like), which are optionally dried, followed by exposure and development to form a prescribed pattern.

The films of the photosensitive composition may be formed by, e.g., spin coating or printing. Printing is preferred in view of an advantage that the photosensitive composition can be used in a small quantity. Where a coating film is formed by spin coating over the whole surface of a substrate, in order to make mounting easy the film may be exposed to light through a photomask so that the external connecting terminal portions of a lead-out electrode are not irradiated by light, and thereafter such portions may preferably be removed by development.

Alternatively the photosensitive composition may previously be molded into a self-supportive film, and this film may be stuck to the surface of a substrate to provide the film thereon. Still alternatively, a thin film of the photosensitive composition may previously be formed on the surface of a support sheet, which is then stuck to the part where the film is to be formed, and thereafter the support sheet may be peeled to provide the film of the photosensitive composition.

When the hole transport layer and the electron transport layer are formed, a material composition may patternwise be printed on only the part from which the external connecting terminal portions of a lead-out electrode have been removed, and thereafter the whole surface may be irradiated by light without use of any photomask to effect cross-linking and make the layer insoluble. Such a method promises a high productivity.

Figure 26A:
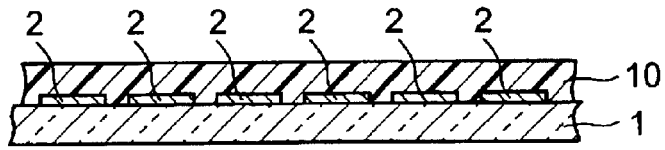
FIGS. 26A to 26F illustrate an example of production steps for the organic-EL device of the present invention.

An example of the process for producing the organic-EL device of the present invention are described below with reference to FIGS. 26A to 26F. First, on a glass substrate 1 on which transparent electrodes (anodes) 2 have been formed in a pattern, a photosensitive material (a photoemission layer material solution containing a material having the property of causing cross-linking reaction upon light irradiation) capable of emitting light of a first color selected arbitrarily from among the three primary colors is coated to form a photoemission layer material coating 10 (FIG. 26A).

Figure 26B:
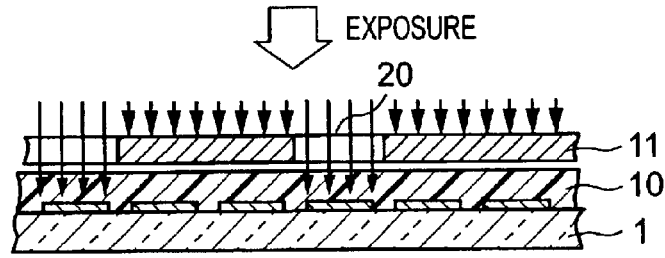
Figure 26C:
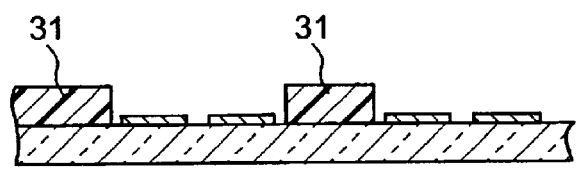
Figure 26D:
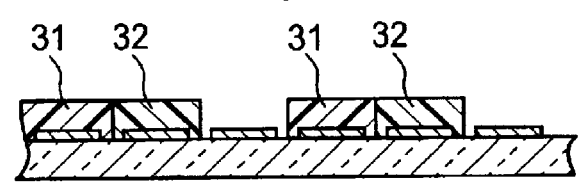
Figure 26E:
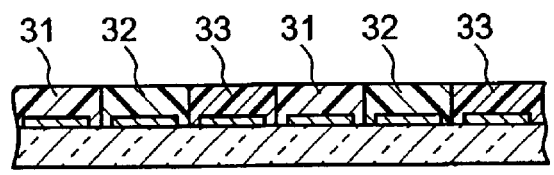
Figure 26F:
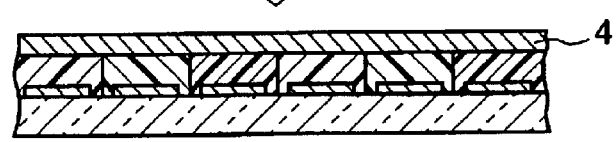

After the coating 10 is optionally dried, the coating film 10 formed is irradiated by light through openings 20 of a photomask 11 to effect exposure (FIG. 26B). In the photoemission layer material coating film 10 thus exposed, crosslinking between molecular chains takes place at a plurality of points in each molecule of the binder polymer, so that the exposed portions turn insoluble in the solvent. After the exposure, the unexposed portions are removed with the solvent, so that first photoemission layers 31 containing the cross-linked high polymer are formed in a pattern (FIG. 26C). The step of forming this pattern of photoemission layers is repeated twice, so that the three-color photoemission layers 31 to 33 are formed (FIGS. 26C to 26E). Here, the first-color photoemission layers 31 already formed are formed of the cross-linked high polymer, and hence by no means dissolve in any solvents used in the second-color and third-color film formation processing.

Figure 27A:
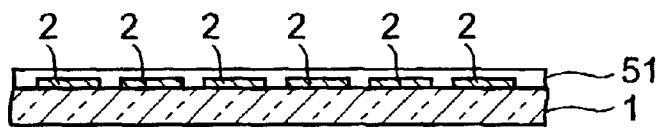
FIGS. 27A to 27I illustrate another example of production steps for the organic-EL device of the present invention.
Figure 27B:
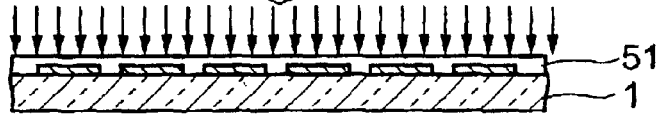
Figure 27C:
Figure 27D:
Figure 27E:
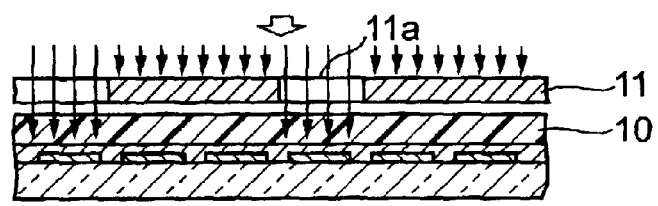
Figure 27F:
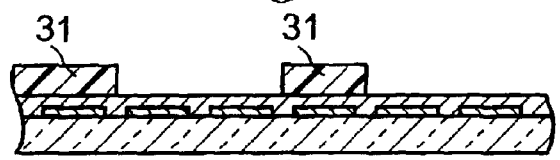
Figure 27G:
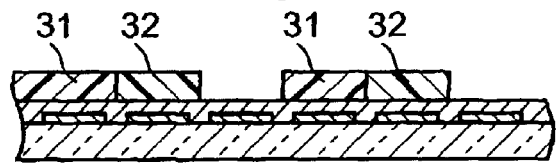
Figure 27H:
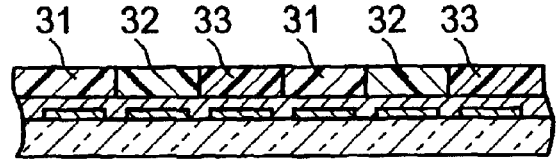
Figure 27I:
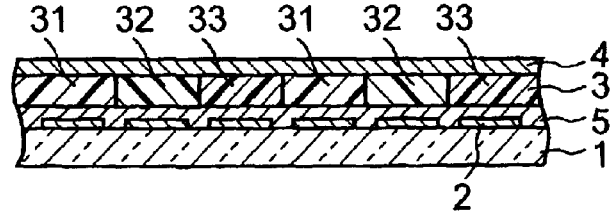

Finally, a cathode 4 is formed to make up the RGB three-primary-color dot matrix full-color display device which can make full-color display. Incidentally, in the case of passive drive, the cathode is formed in the form of stripes falling at right angles with the anodes. In the case of active drive using TFTs (thin-film transistors), its patterning is unnecessary.

Where the photoemission efficiency should have priority over the number of steps, as shown in FIGS. 27A to 27I a hole transport layer photosensitive material film 51 is formed after the anodes 2 have been formed and before a first luminescent material layer 10 is formed (FIG. 27A), which is then optionally dried and then exposed (FIG. 27B) to form the hole transport layer 5 (FIG. 27C). On its surface, the photoemission layers 31 to 33 and the cathode 4 may be formed in the same manner as the steps shown in FIGS. 26A to 26F (FIGS. 27D to 27I).

The hole transport layer is required not to dissolve in any solvents used in the formation of photoemission layers in the subsequent steps. In this example, the cross-linkable high polymer is photo-crosslinked by light irradiation to make the hole transport layer insoluble. Incidentally, the photo-crosslinking need not necessarily be carried out when a solvent-insoluble high polymer such as a heat-curing resin is used in the hole transport layer. For example, when a solvent-insoluble high polymer such as polyphenylenevinylene is used in the hole transport layer, the photo-crosslinking need not necessarily be carried out, and a polyphenylenevinylene precursor may be patternwise printed at display areas, followed by curing to form a polyphenylenevinylene film.

Where a film is formed over the whole surface of an underlying layer as in the case of the hole transport layer 5 in this example, it may be formed by a coating method such as print coating (printing) or spin coating. In the case of print coating, the material is coated on the substrate at its areas except the terminal portions and the whole surface is irradiated by light to effect photo-crosslinking. In the case of spin coating, the material is coated on the whole substrate surface and the surface is irradiated by light through a photomask, and coating films at the terminal portions are not photo-crosslinked and removed by development.

Figure 28A:
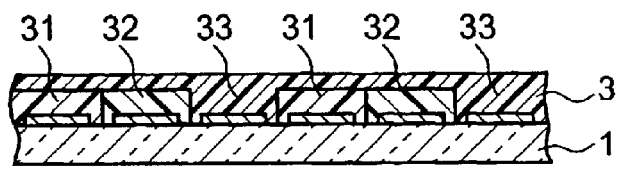
FIGS. 28A and 28B illustrate still another example of production steps for the organic-EL device of the present invention.
Figure 28B:
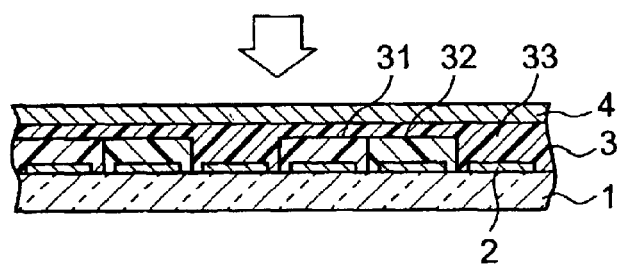
Figure 29A:
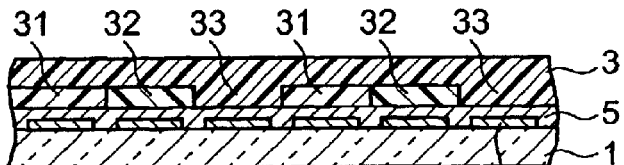
FIGS. 29A and 29B illustrate a further example of production steps for the organic-EL device of the present invention.
Figure 29B:
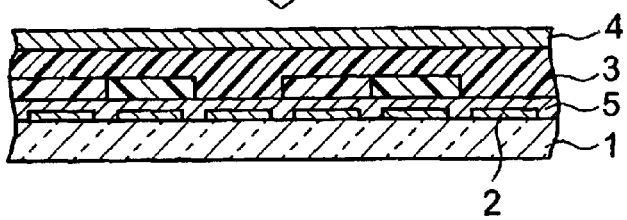

On the other hand, where the number of steps should have priority, the first and second photoemission layers 31 and 32 may be formed in the same manner as the steps shown in FIGS. 26A to 26D or FIGS. 27A to 27G. Thereafter, as shown in FIG. 28A or FIG. 29A, a third photoemission layer 33 may be so formed over the whole surface as to cover the photoemission layers 31 and 32 and the anodes 2 standing uncovered, and the cathode may be formed on the surface of this third photoemission layer 33 (FIG. 28B or FIG. 29B).

A first method for forming this photoemission layer 33 is a method in which a photoemission layer material solution (photosensitive composition) containing a material having the property of emitting third-color light and the property of transporting electrons and holes and also having the property of causing photo-crosslinking reaction upon light irradiation is coated to form a photoemission layer material coating, and, after the coating is optionally dried, the coating film formed is irradiated by light only at the display areas via a photomask to effect curing, followed by removal of unexposed areas at the terminal portions by using a solvent, to form the third photoemission layer 33 containing the cross-linked high polymer.

A second method for forming the photoemission layer 33 is a method in which the above photosensitive composition is coated by print coating to form a coating only at the display area, and, after the coating is optionally dried, the coating film formed is irradiated by light over the whole surface to form the third photoemission layer 33 containing the cross-linked high polymer.

A third method for forming the photoemission layer 33 is a method in which a photoemission layer formation material containing a material having the property of emitting third-color light and the property of transporting electrons and holes is coated by print coating to form a coating only at the display area, and the coating is optionally dried to form the third photoemission layer 33 containing no cross-linked high polymer.

A fourth method for forming the photoemission layer 33 is a method in which a low-molecular-weight luminescent material containing a material having the property of emitting third-color light and the property of transporting electrons and holes is vacuum deposited to form a film only at the display area to form the third photoemission layer 33 containing no cross-linked high polymer.

Figure 30A:
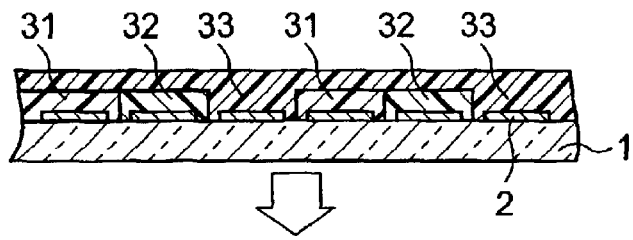
FIGS. 30A to 30C illustrate a still further example of production steps for the organic-EL device of the present invention.
Figure 30B:
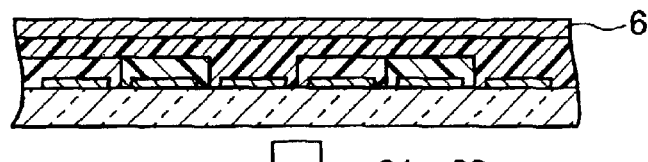
Figure 30C:
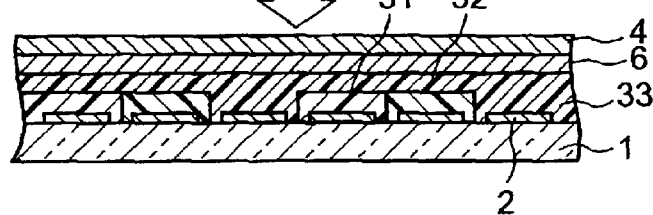
Figure 31A:
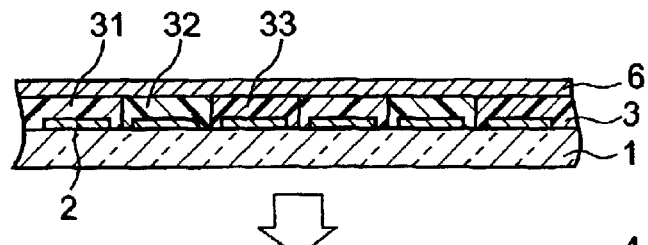
FIGS. 31A and 31B illustrate a still further example of production steps for the organic-EL device of the present invention.
Figure 31B:
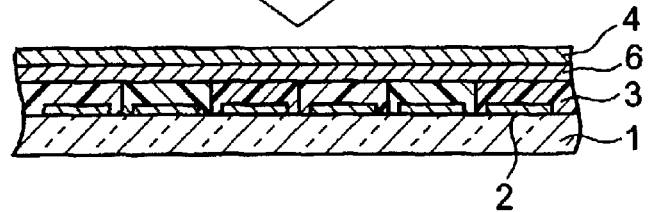

After the third photoemission layer 33 which cover the whole surface has been thus formed (FIG. 30A), the electron transport layer 6 may be formed on its surface (FIG. 30B), and thereafter the cathode 4 may be formed (FIG. 30C). Alternatively, after the photoemission layers 31 to 33 have been formed in the same manner as the steps shown in FIGS. 26A to 26E, the electron transport layer 6 may be formed on its surface (FIG. 31A), and thereafter the cathode 4 may be formed (FIG. 31B).

In these cases, the step of forming the electron transport layer 6 is the final step of forming organic layers. Accordingly, the electron transport layer 6 need not necessarily be insoluble in the solvent, and hence a low-molecular-weight material and a linear high-molecular-weight material may be used. Thus, there can be an advantage that materials may be selected over a very wide range and materials having superior photoemission efficiency, lifetime and color purity can be selected. In the case when the low-molecular-weight material is used, the layer(s) is/are formed by vacuum deposition. In the case of the linear high-molecular-weight material, the layer(s) is/are formed by solution coating. However, the use of the photo-crosslinked high polymer which is the cured product of the photosensitive composition is preferred to the use of the low-molecular-weight material or linear high-molecularweight material, because the material can have a higher glass transition temperature (Tg) to bring about an improvement in long-term operation stability of the device.

In the case when the electron transport layer 6 is formed by coating using a solution containing a high-molecular-weight material, the underlying photoemission layer 33 may preferably be formed by the above first method. According to this method, the film is formed by exposure, using the material having the property of causing photo-crosslinking reaction upon light irradiation, and hence the photoemission layer 33 contains the cross-linked high polymer and stands insoluble in the solvent. Thus, it by no means dissolves in the solvent when the electron transport layer 6 is formed on its surface.

The organic-EL device having the blue-color photoemissive hole transport layer 50 and the hole block layers 34 can also be produced as shown in FIGS. 32A to 32G. More specifically, after the anodes 2 have been formed and before the first luminescent material film 10 is formed, a coating of the photosensitive composition for forming the blue-color photoemissive hole transport layer 50 is formed (FIG. 32A). After the coating is optionally dried, the photoemission layers 31 and 33 are formed in the same manner as the steps shown in FIGS. 27D to 27G (FIGS. 32B to 32F). Next, the hole block layers 34 are formed in a prescribed pattern at the pixel areas in the same manner as the photoemission layers 31 and 33 (FIG. 32G), using a solution of a photosensitive composition for forming the hole block layers, containing a photosensitive material having together the property of blocking the transport of holes, the property of transporting electrons and the property of causing photo-crosslinking reaction upon light irradiation. Then the cathode 4 is formed thereon (FIG. 32G).

Methods for forming the blue-color photoemissive hole transport layer 50 include the following two methods, which, when films are further formed on its surface, may appropriately selected depending on the material used for its formation or film forming method (e.g., whether or not a solvent which may attack the blue-color photoemissive hole transport layer 50).

A first method is a method in which a solution of a material for forming the blue-color photoemissive hole transport layer, containing a material having the property of emitting blue-light color and the property of transporting holes and also having the property of causing photo-crosslinking reaction upon light irradiation is coated to form a coating of the material for forming the blue-color photoemissive hole transport layer, and, after the coating is optionally dried, the coating film formed is irradiated by light only at the display areas via a photomask to effect curing, followed by removal of unexposed areas at the terminal portions by using a solvent, to form the blue-color photoemissive hole transport layer containing the cross-linked high polymer.

A second method for forming the blue-color photoemissive hole transport layer 50 is a method in which a solution of a material for forming the blue-color photoemissive hole transport layer, containing a material having the property of emitting blue-light color and the property of transporting holes and also having the property of causing photo-crosslinking reaction upon light irradiation is coated by print coating to form a coating only at the display area, and, after the coating is optionally dried, the coating film formed is irradiated by light over the whole surface to form the blue-color photoemissive hole transport layer containing the cross-linked high polymer.

Figure 33A:
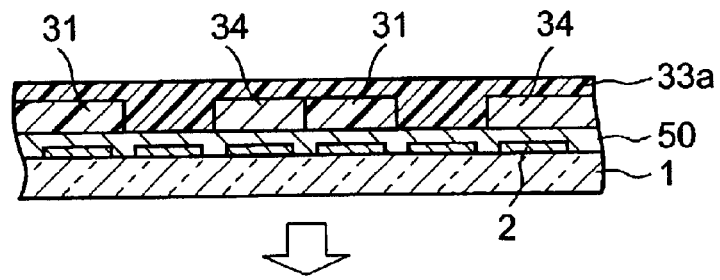
FIGS. 33A and 33B illustrate a still further example of production steps for the organic-EL device of the present invention.
Figure 33B:
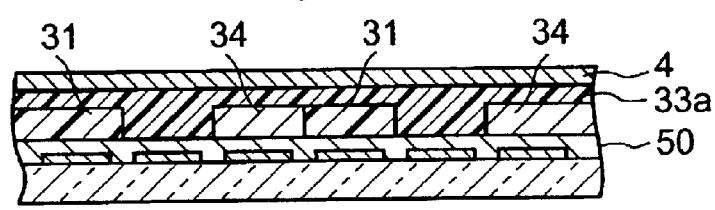

As the green-color photoemission layers 33, a green-color photoemissive electron transport layer 33a may be formed as shown in FIGS. 33A and 33B, using a material having electron transport properties, which is so formed as to cover the photoemission layers 31, the hole block layers 34 and the blue-color photoemissive hole transport layer 50 standing uncovered (FIG. 33A), and the cathode 4 may be formed on its surface (FIG. 33B).

In this case, the step of forming the green-color photoemissive electron transport layer 33a is the final step of forming organic layers. Accordingly, the green-color photoemissive electron transport layer 33a need not necessarily be insoluble in the solvent, and hence a low-molecular-weight material and an uncrosslinkable high-molecular-weight material may be used. In the case when the low-molecular-weight material is used, the layer can be formed by vacuum deposition. In the case of the uncrosslinkable high-molecular-weight material, the layer can be formed by solution coating. However, the use of the cross-linked high polymer is preferred to the use of the low-molecular-weight material or uncrosslinkable high-molecular-weight material, because the material can have a higher glass transition temperature (Tg) to bring about an improvement in long-term operation stability of the device.

Figure 34A:
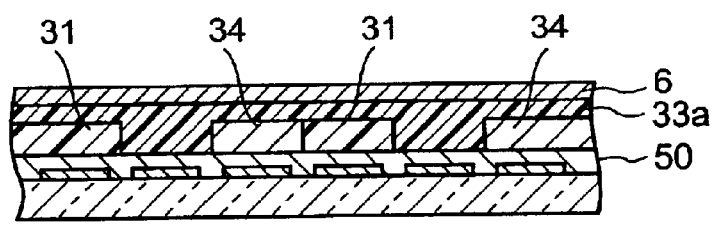
FIGS. 34A and 34B illustrate a still further example of production steps for the organic-EL device of the present invention.
Figure 34B:
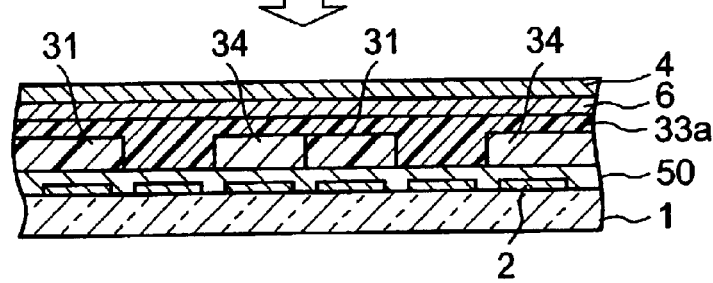

The organic-EL device shown in FIG. 22, the photoemission layers 3 of which comprise the blue-color photoemissive hole transport layer 50, the green-color photoemission layers 33, the hole block layers 34 and the red-color photoemissive electron transport layer 31a can also be produced by a like process but by appropriately selecting luminescent materials.

Where the electron transport layer 6 is formed between the green-color photoemissive electron transport layer 33a and the cathode 4 in order to improve electron transport performance, the green-color photoemissive hole transport layer 33a may be formed in the same manner as the steps shown in FIGS. 32A to 32E and FIG. 33A. Thereafter, the electron transport layer 6 may be formed as shown in FIG. 34A, on the surfaces of pixel areas over the whole display region, and the cathode 4 may be formed as shown in FIG. 34B.

As described above, the process for producing the RGB full-color organic-EL device of the present invention is a process in which at least part of the photoemission layers is formed in a pattern by photolithographic processing. Thus, RGB patterns can be formed by a simple process in a better precision than conventional low-polymer mask vacuum deposition and ink-jet printing.

The foregoing examples concern processes used when the full-color display devices having RGB three-primary-color photoemission layer patterns are produced. These processes are applicable to the multiple-color area color display device as long as the patterns of photoemission layers are changed. An example of a process by which a multiple-color area color display organic-EL device having RGB three-primary-color photoemission layer logotypes is shown in FIGS. 35A to 35G.

Figure 35A:
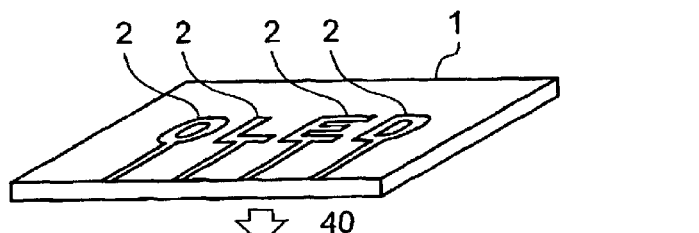
FIGS. 35A to 35G illustrate a still further example of production steps for the organic-EL device of the present invention.

First, on a glass substrate 1 on which transparent electrodes (anodes) 2 have been formed in a pattern, a first-color photosensitive composition (a photoemission layer material solution containing a material capable of emitting light of a first color and also having the property of causing cross-linking reaction upon light irradiation) is coated to form a photoemission layer material coating 40 (FIG. 35A).

Figure 35B:
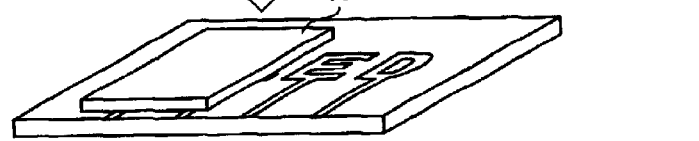
Figure 35C:
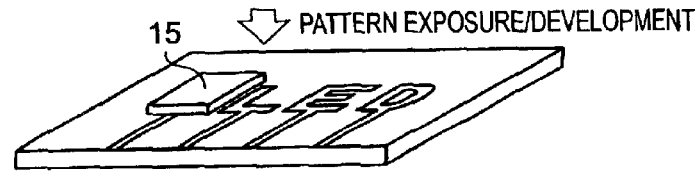
Figure 35D:
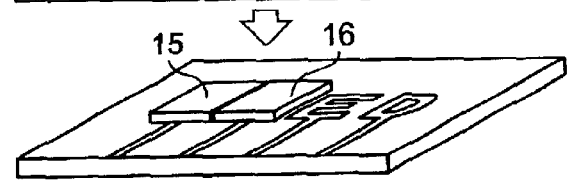
Figure 35E:
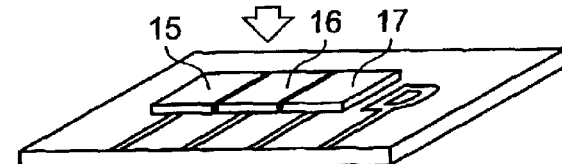
Figure 35F:
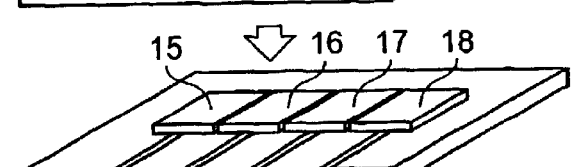
Figure 35G:
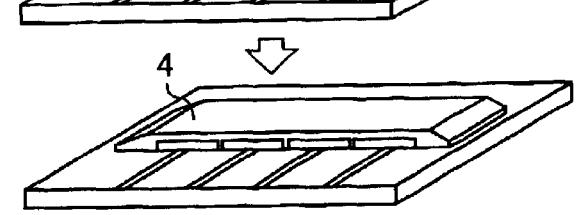

After the coating 40 is optionally dried, the coating film formed is irradiated by light via a photomask to effect exposure. In the photoemission layer material coating film 40 thus exposed, cross-linking between molecular chains takes place at a plurality of points in each molecule of the binder polymer, so that the exposed portions turn insoluble in the solvent. After the exposure, the unexposed portions are removed with the solvent, so that a photoemission layer 15 containing the cross-linked high polymer is formed in a pattern (FIG. 35B).

The like procedure is repeated to form second- to fourth-color photoemission layers 16 to 18 are sequentially formed in patterns (FIGS. 35C to 35F). Here, the photoemission layer patterns already formed have been made insoluble by means of the cross-linked high polymer, and hence by no means dissolve in any solvents used in the second-color and following film formation processing.

Finally, a cathode 4 is formed to make up the organic-EL device which can make multiple-color area color display In the multiple-color area color display device, the photosensitive composition may patternwise be printed when the photoemission layer patterns 15 to 18 are formed. Such pattern printing enables whole-area exposure without masking to effect curing, and hence the step of development is unnecessary, making it possible to produce the device more simply than the above method. This method is very effective when relatively rough patterns are formed.

As described above, the present invention enables simple production of organic-EL devices which can make three-primary-color dot matrix full-color display or multiple-color area color display device. Incidentally, described in the foregoing examples are organic-EL devices for color display, but monochromatic display organic-EL devices can also be produced with ease by the process according to the present invention and are embraced in the present invention. Also, organic-EL devices involving both the dot matrix display and the area display (such as logotypes) can be produced with ease by the process according to the present invention.

The organic-EL device of the present invention and the process for its production are described below in greater detail by giving Examples. The present invention is by no means limited to these Examples only.

EXAMPLE 1

A first working example is described below.

Figure 39:
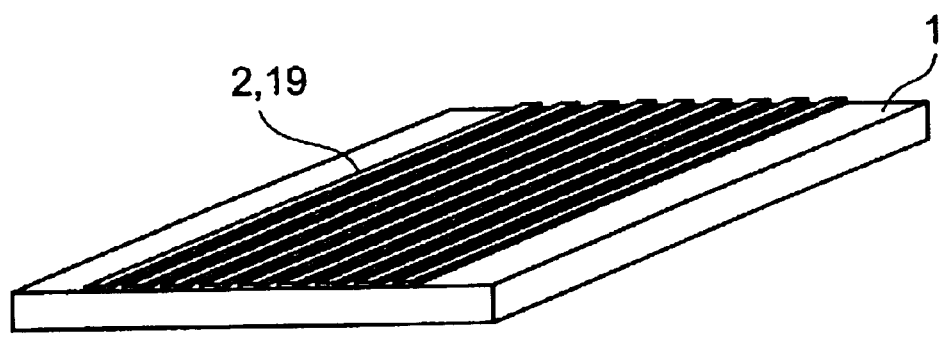
FIG. 39 is a perspective view showing a glass substrate on which stripe-shaped ITO electrodes have been formed.

On the whole surface of one of the both sides of a glass substrate of 0.7 mm in thickness and 25×25 mm in size, an ITO (indium tin oxide) film having a thickness of 200 nm and a sheet resistance of 15 W was formed by EB (electron beam) vacuum deposition. The ITO film thus formed was subjected to etching to form, as the anode, nine stripes 19 as shown in FIG. 39, each having a width of 1.0 mm and a length of 25 mm and at intervals of 1.0 mm.

Next, after the surface of this substrate with the anode was subjected to oxygen plasma treatment, a photosensitive composition for forming green-color photoemission layers was spin-coated at 3,000 rpm, followed by drying at 80° C. for 30 minutes to form a film of the photosensitive composition. Here, the photosensitive composition for forming green-color photoemission layers comprises 0.55 g of a binder polymer, 0.05 g of coumarin-6 represented by the structural formula (18), 0.35 g of an oxadiazole derivative represented by the structural formula (19), 0.1 g of Michler's ketone represented by the structural formula (20) and 10 g of N-methylpyrrolidone.

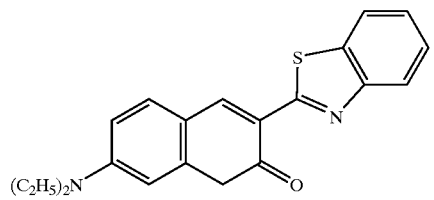

(18)

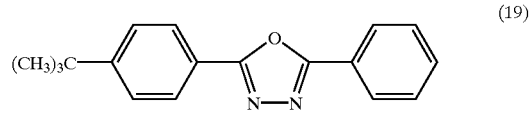

(19)

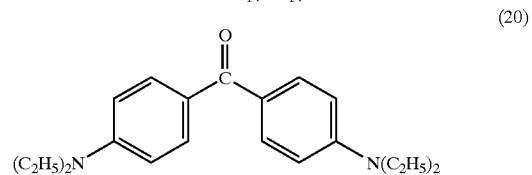

(20)

In the present example, used as the binder polymer was a random copolymer having a repeating unit represented by the structural formula (21) and a repeating unit represented by the structural formula (22), i.e., polyvinyl carbazole part of a carbazole group in the molecule of which has been substituted with a cinnamoyl group. In the formulas (21) and (22), n and m are each an integer of 1 or more, where polymerization ratio n:m is 1.1 and weight-average molecular weight is 160,000. This copolymer is hereinafter simply called a polyvinyl carbazole derivative.

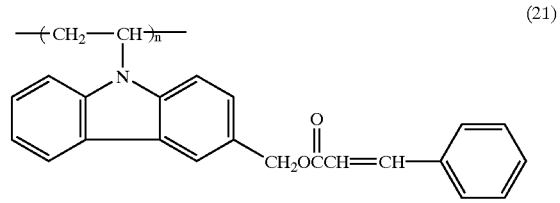

(21)

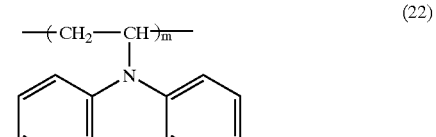

(22)

This polyvinyl carbazole derivative transports holes injected from the anode. Also, the oxadiazole derivative transports electrons injected from the cathode. The coumarin-6 is a compound which causes the injected holes and electrons to recombine to effect green-color photoemission.

Figure 40:
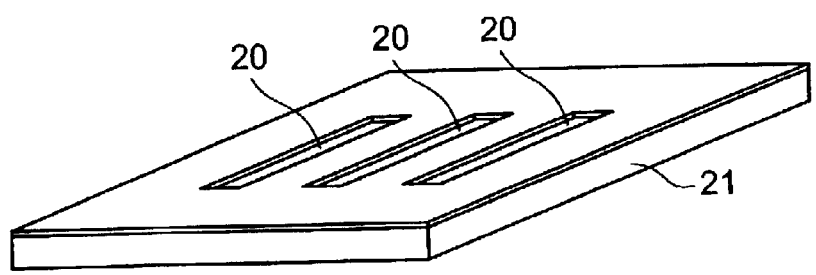
FIG. 40 is a perspective view showing an exposure mask used in Examples.

Next, the photosensitive composition film thus formed was exposed to ultraviolet radiation via photomask 21 (FIG. 40) provided with three stripes of openings 20 each having a width of 2.0 mm and a length of 12 mm and at intervals of 4.0 mm. Here, the photomask 21 was so disposed that the center line of each ITO stripe 19 come into agreement with the center line of each photomask opening 20. As a light source, a high-pressure mercury lamp having an exposure illumination of 45 mW/cm$^2$ was used, by means of which the exposure was made for 60 minutes so as to be in a total exposure dose of 2,700 mJ. Subsequently, this was immersed in N-methylpyrrolidone for 1 minute to remove unexposed-area films by development, followed by rinsing with acetone and thereafter drying at 80° C. for 30 minutes.

Figure 41:
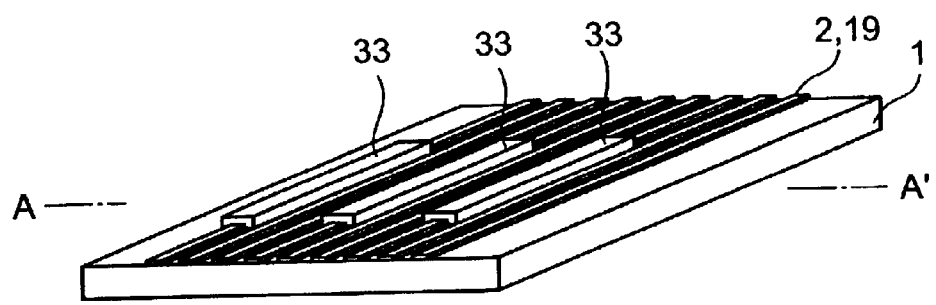
FIG. 41 is a perspective view showing a substrate which is in a state where green-color photoemission layers have been formed thereon.
Figure 42:
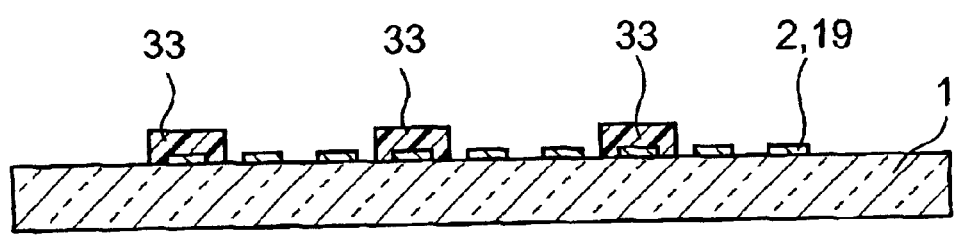
FIG. 42 is a cross-sectional view showing a substrate which is in a state where green-color photoemission layers have been formed thereon.

Through these steps, green-color photoemission layer stripes 33 were formed as shown in FIGS. 41 and 42. Incidentally, FIG. 42 is a cross-sectional view along the line A–A' in FIG. 41. The photoemission layers 33 thus formed have a structure wherein the coumarin-6 and the oxadiazole derivative are confined in the networks of the polyvinyl carbazole cross-linked with cinnamoyl groups, and hence do not dissolve in any solvent used in the following subsequent step.

Next, a photosensitive composition for forming red-color photoemission layers, comprising 0.55 g of the polyvinyl carbazole derivative, 0.35 g of the oxadiazole derivative, 0.15 g of an aromatic bisazide represented by the structural formula (23), 0.05 g of Nile Red represented by the structural formula (24) and 10 g of N-methylpyrrolidone, was spin-coated at 3,000 rpm. Nile Red is a fluorescent coloring matter dopant for red-color photoemission.

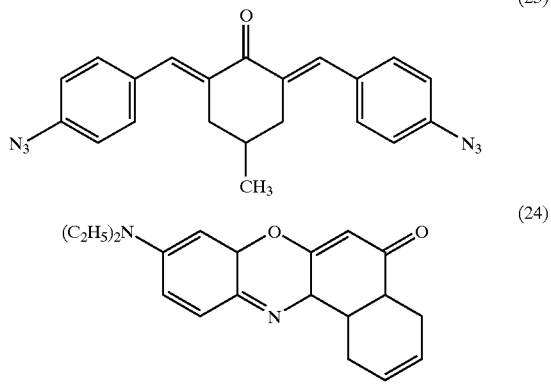

Figure 43:
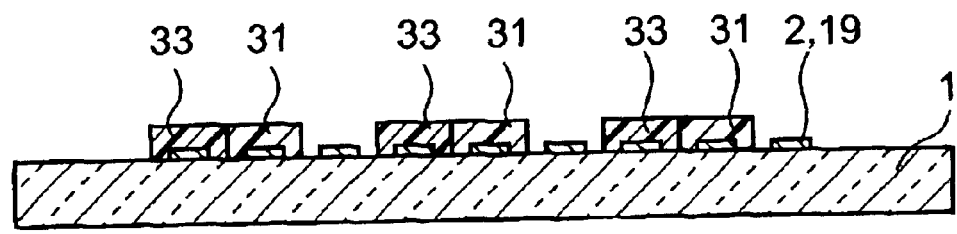
FIG. 43 is a cross-sectional view showing a substrate which is in a state where red-color and green-color photoemission layers have been formed thereon.

The photomask used to form the green-color photoemission layer stripes was disposed at a position moved in parallel by 2 mm from that at the time of the formation of the green-color photoemission layer stripes, and exposure and development were carried out in the same manner as the step of forming the green-color photoemission layers to form red-color photoemission layers 31 (FIG. 43). Like the case of the green-color photoemission layers, the red-color photoemission layers 31 thus formed have a structure wherein Nile Red and the oxadiazole derivative are confined in the networks of the polyvinyl carbazole cross-linked with cinnamoyl groups, and hence do not dissolve in any solvent used in the following subsequent step.

Figure 44:
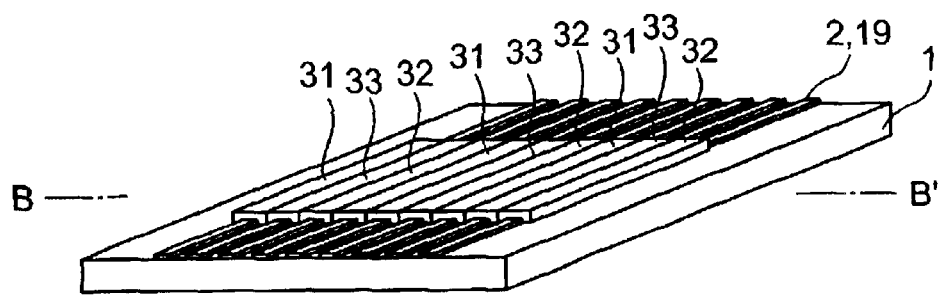
FIG. 44 is a perspective view showing a substrate which is in a state where three-color photoemission layers have been formed thereon.

Next, using a photosensitive composition for forming blue-color photoemission layers, comprising 0.55 g of the polyvinyl carbazole derivative, 0.35 g of the oxadiazole derivative, 0.02 g of 1,1,4,4-tetraphenyl-1,3-butadiene represented by the structural formula (25), 0.1 g of Michler's ketone and 10 g of N-methylpyrrolidone, the coating, exposure and development were carried out in the same manner as the above steps to form blue-color photoemission layers 32 (FIG. 44).

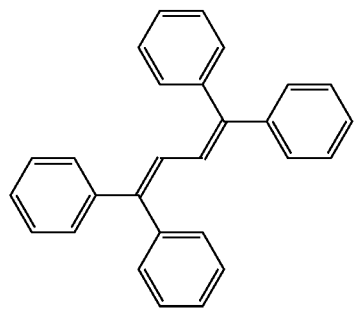

The blue-color photoemission layers 32 thus formed have a structure wherein the 1,1,4,4-tetraphenyl-1,3-butadiene and the oxadiazole derivative are confined in the networks of the polyvinyl carbazole cross-linked with cinnamoyl groups.

The polyvinyl carbazole derivative transports holes injected from the anode, and the oxadiazole derivative transports electrons injected from the cathode. The 1,1,4,4-tetraphenyl-1,3-butadiene is a compound which causes the injected holes and electrons to recombine to effect blue-color photoemission.

Figure 45:
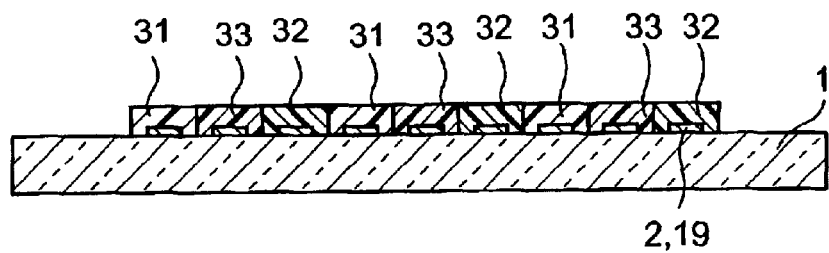
FIG. 45 is a cross-sectional view showing a substrate which is in a state where three-color photoemission layers have been formed thereon.

Thus, as shown in FIGS. 44 and 45, a panel having stripe patterns 31 to 33 consisting of green, red and blue three colors was obtained. FIG. 45 is a cross-sectional view along the line B–B' in FIG. 44. The photoemission layers 31 to 33 were each in a thickness of 100 nm.

Next, using a vacuum deposition mask having an opening of 16×25 mm in size, a 200 nm thick cathode 4 comprised of Mg/Ag (1/10) was formed by vacuum co-deposition.

Figure 46:
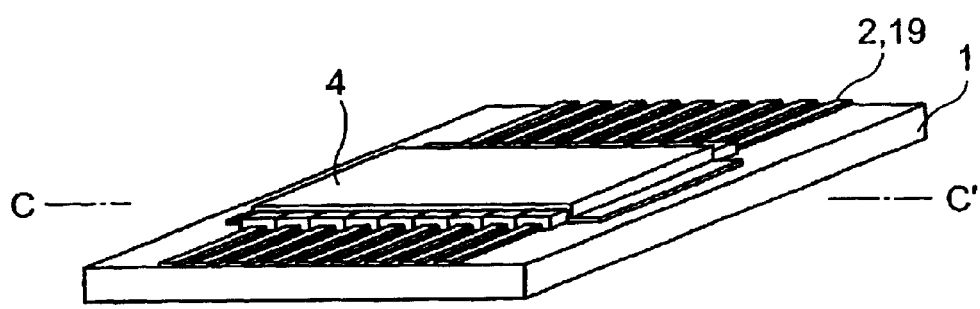
FIG. 46 is a perspective view of an organic-EL device produced in Example 1.
Figure 47:
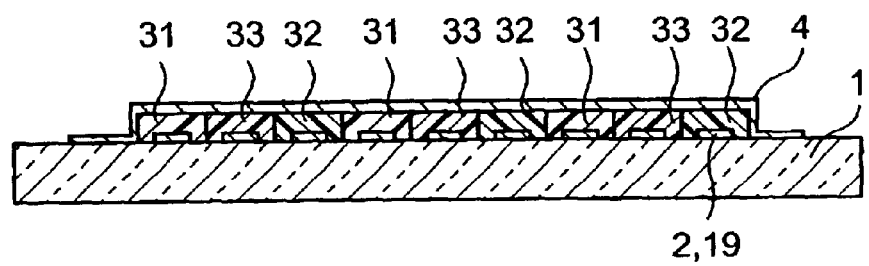
FIG. 47 is a cross-sectional view of the organic-EL device produced in Example 1.

The organic-EL device thus obtained is shown in FIGS. 46 and 47. FIG. 4' is a cross-sectional view along the line C–C' in FIG. 46. Setting the ITO as the anodes 2 and the Mg/Ag as the cathode 4, a voltage of 10 V was applied to this device by means of a DC power source, whereupon the green, red and blue three-color light was emitted in stripes.

EXAMPLE 2

A second working example is described below.

The same glass substrate with an ITO pattern as that used in Example 1 was subjected to oxygen plasma treatment. Thereafter, a coating of a photosensitive composition for forming a hole transport layer was formed on the whole pixel areas by flexographic printing, followed by drying at 80° C. for 30 minutes to form a film of the photosensitive composition. Here, in the present example, a composition comprising 0.35 g of the polyvinyl carbazole derivative, 0.1 g of Michler's ketone and 10 g of N-methylpyrrolidone was used as the photosensitive composition for forming the hole transport layer.

Next, the whole surface of the coating film formed was exposed to ultraviolet radiation for 60 seconds, using a high-pressure mercury lamp having an exposure illumination of 45 mW/cm². Here, the total exposure dose was 2,700 mJ. Thus, a hole transport layer having a thickness of 50 nm was formed.

Next, green, red and blue three-color stripe-shaped photoemission layers 31 to 33 and the cathode 4 were formed in the same manner as in Example 1 to obtain an organic-EL device. A voltage of 10 V was applied to this device, whereupon the green, red and blue three-color light was seen to be emitted in stripes.

EXAMPLE 3

A third working example is described below.

The same glass substrate with an ITO pattern as that used in Example 1 was subjected to oxygen plasma treatment. Thereafter, using a solution comprising 0.3 g of a polyphenylenevinylene precursor represented by the structural formula (26) and 10 g of butyl cellosolve, a coating of was formed on the pixel areas by flexographic printing.

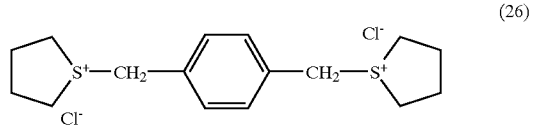
(26)

Next, this coating was subjected to heat treatment at 250° C. for 1 hour in an atmosphere of nitrogen to convert it into a hole transport layer comprised of polyphenylenevinylene. The layer was in a thickness of 50 nm. Subsequently, green, red and blue three-color stripe-shaped photoemission layers 31 to 33 and the cathode 4 were formed in the same manner as in Example 1 to obtain an organic-EL device. A voltage of 10 V was applied to this device, whereupon the green, red and blue three-color light was emitted in stripes.

EXAMPLE 4

A fourth working example is described below.

In the present example, a solution comprising 0.55 g of the polyvinyl carbazole (weight-average molecular weight: 1,100,000) represented by the structural formula (22) set out previously, 0.15 g of the aromatic bisazide represented by the structural formula (23), 0.05 g of coumarin-6, 0.35 g of the oxadiazole derivative represented by the structural formula (19) and 10 g of N-methylpyrrolidone was used as the photosensitive composition for forming green-color photoemission layers.

As the photosensitive composition for forming red-color photoemission layers, a solution comprising 0.55 g of the polyvinyl carbazole represented by the structural formula (22), 0.15 g of the aromatic bisazide represented by the structural formula (23), 0.05 g of Nile Red, 0.35 g of the oxadiazole derivative represented by the structural formula (19) and 10 g of N-methylpyrrolidone was also used.

As the photosensitive composition for forming blue-color photoemission layers, a solution comprising 0.55 g of the polyvinyl carbazole represented by the structural formula (22), 0.15 g of the aromatic bisazide represented by the structural formula (23), 0.02 g of 1,1,4,4-tetraphenyl-1,3-butadiene, 0.35 g of the oxadiazole derivative represented by the structural formula (19) and 10 g of N-methylpyrrolidone was used.

The procedure of Example 1 was repeated except for using these compositions for forming photoemission layers, to produce an organic-EL device in which the anodes 2, the green, red and blue three-color stripe-shaped photoemission layers 31 to 33 and the cathode 4 were superposed on the glass substrate 1. A voltage of 10 V was applied to the device thus obtained, whereupon the green, red and blue three-color light was emitted in stripes.

EXAMPLE 5

A fifth working example is described below.

The hole transport layer comprised of a cross-linked high polymer and the stripe-shaped three-primary-color photoemission layers comprised of a cross-linked high polymer, a coloring matter, an electron-transporting material and a hole-transporting material were formed in the same manner as in Example 2.

Next, a photosensitive composition for forming an electron transport layer, comprising 0.6 g of polymethyl methacrylate (weight-average molecular weight: 230,000), 0.35 g of the aromatic bisazide represented by the structural formula (23), 0.3 g of tris(8-quinolinolato)aluminum represented by the structural formula (27) and 10 g of N-methylpyrrolidone, was patternwise printed by flexographic printing at the center area of the substrate, followed by drying to form an electron transport layer with a thickness of 30 nm.

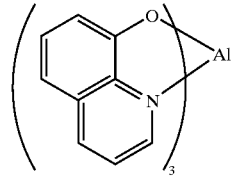
(27)

Next, the cathode was formed in the same manner as in Example 1 to obtain an organic-EL device. A voltage of 10 V was applied to this device, whereupon the green, red and blue three-color light was emitted in stripes.

EXAMPLE 6

A sixth working example is described below.

The hole transport layer comprised of a cross-linked high polymer and the stripe-shaped three-primary-color photoemission layers comprised of a cross-linked high polymer, a coloring matter, an electron-transporting material and a hole-transporting material were formed in the same manner as in Example 2.

Next, an electron transport layer with a thickness of 30 nm, consisting of a thin film of the tris(8-quinolinolato) aluminum, was formed by vacuum deposition, and thereafter the cathode was formed in the same manner as in Example 1 to obtain an organic-EL device. A voltage of 10 V was applied to this device, whereupon the green, red and blue three-color light was emitted in stripes.

EXAMPLE 7

A seventh working example is described below.

On the whole surface of a glass substrate of 0.7 mm in thickness and 25×25 mm in size, an ITO film having a thickness of 200 nm and a sheet resistance of 15 W was formed by EB vacuum deposition. The ITO film thus formed was subjected to patterning in logotypes as the anode as shown in FIG. 35A.

After the surface of this substrate with the anode was subjected to oxygen plasma treatment, the same photosensitive composition 40 for forming green-color photoemission layers as that in Example 1 was spin-coated at 3,000 rpm, followed by drying at 80° C. for 30 minutes to form a film. Then, the film was exposed to ultraviolet radiation at its part involving the letter "O" and letter "D" via a photomask, followed by development to form green-color photoemission layers. Then, the same photosensitive composition for forming red-color photoemission layers as that in Example 1 was also spin-coated at 3,000 rpm, followed by drying at 80° C. for 30 minutes to form a film. Thereafter, the film was exposed to ultraviolet radiation at its part involving the letter "L" via a photomask, followed by development to form a red-color photoemission layer. Subsequently, the same photosensitive composition for forming blue-color photoemission layers as that in Example 1 was spin-coated at 3,000 rpm, followed by drying at 80° C. for 30 minutes to form a film. Thereafter, the film was exposed to ultraviolet radiation at its part involving the letter "E" via a photomask, followed by development to form a blue-color photoemission layer.

As the light source used when the photosensitive composition films were exposed, a high-pressure mercury lamp having an exposure illumination of 45 mW/cm$^2$ was used, by means of which the exposure was made for 60 minutes so as to be in a total exposure dose of 2,700 mJ. Also, as to the development, the films were immersed in N-methylpyrrolidone for 1 minute to remove unexposed-area films, followed by rinsing with acetone and thereafter drying at 80° C. for 30 minutes.

Next, on the part involving this logotype, the same photosensitive composition for forming an electron transport layer as that in Example 6 was patternwise printed by flexographic printing, followed by drying at 80° C. for 30 minutes to form an electron transport layer with a thickness of 30 nm. Subsequently, using a vacuum deposition mask, a 200 nm thick cathode 4 consisting of Mg/Ag (1/10) was formed by vacuum co-deposition to obtain an organic-EL device.

To this device, setting the ITO as the anode and the Mg/Ag as the cathode, a voltage of 10 V was applied by means of a DC power source, whereupon the layers at the part of the letter "O" and letter "D" emitted light in green color, the letter "L" in red color, and the letter "E" in blue color.

EXAMPLE 8

An eighth working example is described below.

Figure 48:
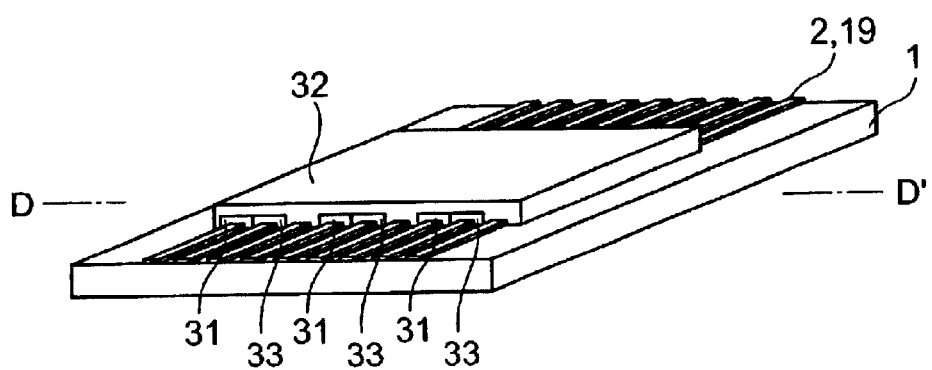
FIG. 48 is a perspective view of a substrate (with photoemission layers) standing before the cathode is formed in Example 8.
Figure 49:
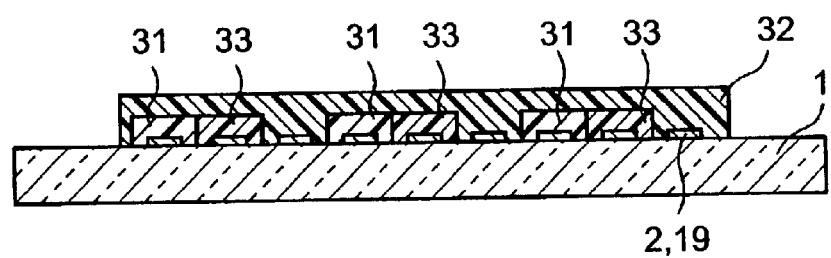
FIG. 49 is a cross-sectional view of the substrate (with photoemission layers) standing before the cathode is formed in Example 8.

An organic-EL device was produced in the same manner as in Example 1 except that the green-color photoemission layers 33 and red-color photoemission layers 31 were each formed as shown in FIG. 48 in a thickness of 50 nm, and the blue-color photoemission layer 32 in a thickness of 100 nm. Also, in the exposure to form the blue-color photoemission layers 32, a photomask made of quartz and having an opening of 16×25 mm was used. Thus, as shown in FIG. 48, the blue-color photoemission layer 32 was so formed as to cover the green-color photoemission layers 33 and red-color photoemission layers 31. A cross-sectional view along the line D–D' in FIG. 48 is shown in FIG. 49.

Figure 50:
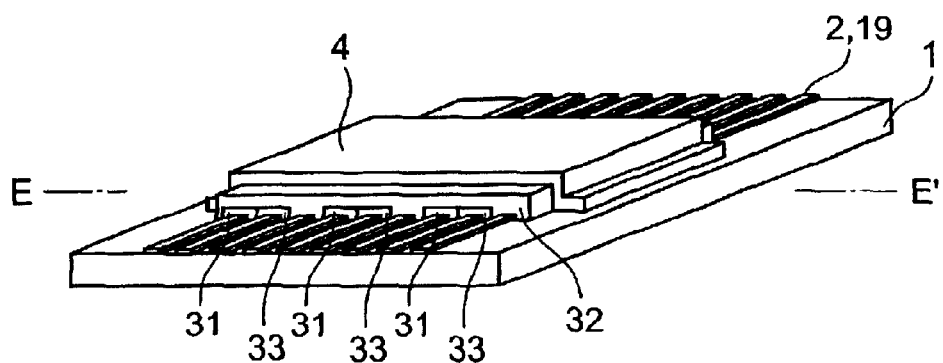
FIG. 50 is a perspective view of an organic-EL device produced in Example 8.
Figure 51:
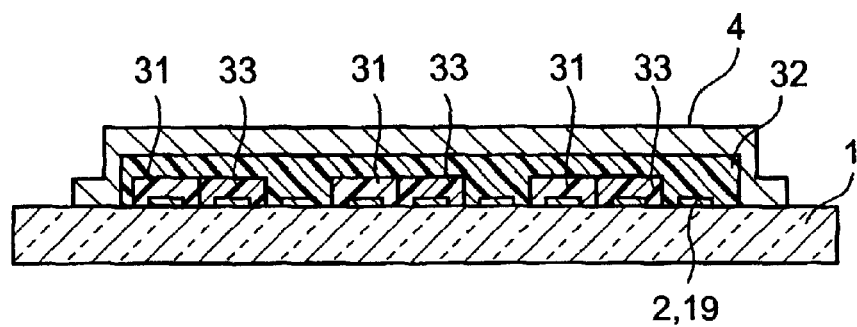
FIG. 51 is a cross-sectional view of an organic-EL device produced in Example 8.

The cathode 4 was formed in the same manner as in Example 1 to obtain an organic-EL device shown in FIG. 50. A cross-sectional view along the line E–E' in FIG. 50 is shown in FIG. 51. To this device, setting the ITO as the anode and the Mg/Ag as the cathode, a voltage of 10 V was applied by means of a DC power source, whereupon the green, red and blue three-color light was emitted in stripes.

EXAMPLE 9

A ninth working example is described below.

An organic-EL device was produced in the same manner as in Example 2 except that the respective photoemission layers 31 to 33 were formed in the same manner as in Example 8 in the like layer thickness and using the like exposure mask for the blue-color photoemission layer. To the device thus obtained, a voltage of 10 V was applied, whereupon the green, red and blue three-color light was emitted in stripes.

EXAMPLE 10

A tenth working example is described below.

An organic-EL device was produced in the same manner as in Example 3 except that the respective photoemission layers 31 to 33 were formed in the same manner as in Example 8 in the like layer thickness and using the like exposure mask for the blue-color photoemission layer.

To the device thus obtained, a voltage of 10 V was applied, whereupon the green, red and blue three-color layers emitted light in stripes.

EXAMPLE 11

An eleventh working example is described below.

An organic-EL device was produced in the same manner as in Example 4 except that the respective photoemission layers 31 to 33 were formed in the same manner as in Example 8 in the like layer thickness and using the like exposure mask for the blue-color photoemission layer.

To the device thus obtained, a voltage of 10 V was applied, whereupon the green, red and blue three-color light was emitted in stripes.

EXAMPLE 12

A twelfth working example is described below.

An organic-EL device was produced in the same manner as in Example 5 except that the respective photoemission layers 31 to 33 were formed in the same manner as in Example 8 in the like layer thickness and using the like exposure mask for the blue-color photoemission layer and the tris(8-quinolinolato)aluminum was replaced with 0.35 g of the oxadiazole derivative represented by the structural formula (19). To the device thus obtained, a voltage of 10 V was applied, whereupon the green, red and blue three-color light was emitted in stripes.

EXAMPLE 13

A thirteenth working example is described below.

An organic-EL device was produced in the same manner as in Example 6 except that the respective photoemission layers 31 to 33 were formed in the same manner as in Example 8 in the like layer thickness and using the like exposure mask for the blue-color photoemission layer. To the device thus obtained, a voltage of 10 V was applied, whereupon the green, red and blue three-color light was emitted in stripes.

EXAMPLE 14

A fourteenth working example is described below with reference to FIGS. 32A to 32G.

The same glass substrate with ITO stripes as that used in Example 1 was subjected to oxygen plasma treatment. Thereafter, a photosensitive composition for forming a blue-color photoemissive hole transport layer, comprising 0.35 g of the polyvinyl carbazole derivative, 0.05 g of Michler's ketone and 10 g of N-methylpyrrolidone, was spin-coated at 3,000 rpm, followed by drying at 80° C. for 30 minutes to form a coating film.

Then, the coating film formed was exposed to ultraviolet radiation via a photomask made of quartz and having an opening of 16×25 mm was used. As a light source, a high-pressure mercury lamp having an exposure illumination of 45 mW/cm$^2$ was used, by means of which the exposure was made for 60 minutes so as to be in a total exposure dose of 2,700 mJ. Next, this was immersed in N-methylpyrrolidone for 1 minute to remove unexposed-area films by development, followed by rinsing with acetone and thereafter drying at 80° C. for 30 minutes. Thus, the blue-color photoemissive hole transport layer 50 having a layer thickness of 80 nm was formed on the whole surface of pixel-forming region. (FIG. 32A).

The polyvinyl carbazole derivative transports holes injected from the anode and at the same time contributes to blue-color photoemission in the course of recombination of electrons and holes. The blue-color photoemissive hole transport layer 50 thus formed has a structure wherein the polyvinyl carbazole derivative has cross-linked, and hence does not dissolve in any solvent used in the following subsequent step.

On the surface of this blue-color photoemissive hole transport layer 50, red-color photoemission layers 31 each having a layer thickness of 80 nm were formed in the same manner as in Example 1 (FIGS. 32B to 32D), using a photosensitive composition for forming red-color photoemission layers, comprising 0.35 g of the polyvinyl carbazole derivative, 0.55 g of the same oxadiazole derivative as that used in Example 1, 0.05 g of Nile Red, 0.05 g of Michler's ketone and 10 g of N-methylpyrrolidone.

Next, green-color photoemission layers 33 each having a layer thickness of 80 nm were formed in the same manner as in Example 1 (FIG. 32E), using a photosensitive composition for forming green-color photoemission layers, comprising 0.35 g of the polyvinyl carbazole derivative, 0.55 g of the same oxadiazole derivative as that used in Example 1, 0.05 g of coumarin-6, 0.05 g of Michler's ketone and 10 g of N-methylpyrrolidone.

Subsequently, a photosensitive composition for forming hole block layers, comprising 0.5 g of polyvinyl cinnamate represented by the structural formula (28), 0.15 g of bathocuproin represented by the structural formula (29), 0.25 g of the same oxadiazole derivative as that in Example 1, 0.1 g g of Michler's ketone and 10 g of N-methylpyrrolidone, was spin-coated at 3,000 rpm on the blue-color photoemissive hole transport layer 50 on which the red-color and green-color hole block layers had been formed, followed by drying at 80° C. for 30 minutes. The oxadiazole derivative transports electrons injected from the cathode, and the bathocuproin is used to shut out the transport of holes.

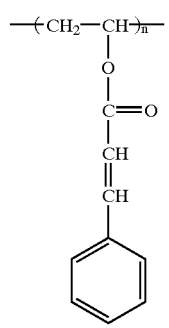

(28)

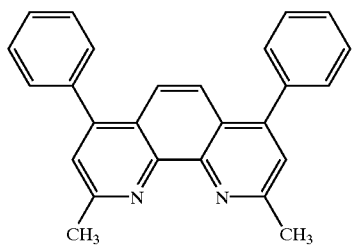

(29)

In the formula (28), n is an integer.

The photomask was disposed at a position moved in parallel by 2 mm from the position at which the green-color photoemission layers were formed, and exposure and development were carried out in the same manner as the step of forming the above photoemission layers to form hole block layers 34 each having a layer thickness of 80 nm (FIG. 32F).

Like the case of the green-color photoemission layers, the hole block layers 34 thus formed have a structure wherein bathocuproin and the oxadiazole derivative are confined in the networks of the polyvinyl carbazole cross-linked with cinnamoyl groups, and hence do not dissolve in any solvent used in the following subsequent step.

Next, a photosensitive composition for forming an electron transport layer, comprising 0.6 g of polymethyl methacrylate represented by the structural formula (30), 0.15 g and 0.35 g of the same aromatic bisazide and oxadiazole derivative, respectively, as those in Example 1 and 10 g of N-methylpyrrolidone, was patternwise printed by flexographic printing at the center area of the substrate, followed by exposure to ultraviolet radiation over the whole surface under the same exposure conditions as the case of the above photoemission layers, to form an electron transport layer 6 with a thickness of 50 nm.

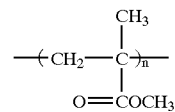

(30)

In the formula (30), n is an integer.

Finally, the cathode 4 was formed in the same manner as in Example 1 to obtain an organic-EL device shown in FIG. 32G. To this device, setting the ITO as the anode and the Mg/Ag as the cathode, a voltage of 10 V was applied by means of a DC power source, whereupon the green, red and blue three-color light was emitted in stripes.

EXAMPLE 15

A fifteenth working example is described below.

The ITO electrodes, blue-color photoemissive hole transport layer, red-color photoemission layers, green-color photoemission layers, hole block layers, electron transport layer and cathode were formed on the surface of the glass substrate to obtain an organic-EL device in the same manner as in Example 14 except that, in the photosensitive composition for forming the blue-color photoemissive hole transport layer, 0.02 g of 1,1,4,4-tetraphenyl-1,3-butadiene was mixed and the Michler's ketone was mixed in an amount of 0.1 g.

To this device, setting the ITO as the anode and the Mg/Ag as the cathode, a voltage of 10 V was applied by means of a DC power source, whereupon the green, red and blue three-color light was emitted in stripes.

EXAMPLE 16

A sixteenth working example is described below.

The ITO electrodes, blue-color photoemissive hole transport layer, green-color photoemission layers, red-color photoemission layers, hole block layers, electron transport layer and cathode were formed on the surface of the glass substrate to obtain an organic-EL device in the same manner as in Example 14 except that a solution comprising 0.6 g of polymethyl methacrylate, 0.35 g of the same oxadiazole derivative as that used in Example 1 and 10 g of N-methylpyrrolidone was used as the photosensitive composition for forming the electron transport layer.

To the device thus obtained, setting the ITO as the anode and the Mg/Ag as the cathode, a voltage of 10 V was applied by means of a DC power source, whereupon the green, red and blue three-color light was emitted in stripes.

EXAMPLE 17

A seventeenth working example is described below.

The ITO electrodes, blue-color photoemissive hole transport layer, green-color photoemission layers, red-color photoemission layers, hole block layers, electron transport layer and cathode were formed on the surface of the glass substrate to obtain an organic-EL device in the same manner as in Example 14 except that the electron transport layer (thickness: 50 nm) was formed using a vacuum deposition mask having an opening of 16×25 mm was used and formed by vacuum deposition of tris(8-quinolinolato) aluminum.

To the device thus obtained, setting the ITO as the anode and the Mg/Ag as the cathode, a voltage of 10 V was applied by means of a DC power source, whereupon the green, red and blue three-color light was emitted in stripes.

EXAMPLE 18

A eighteenth working example is described below.

As shown in FIG. 33A, the ITO electrodes 2, blue-color photoemissive hole transport layer 50, red-color photoemission layers 31 and hole block layers 34 were formed on the surface of the substrate 1 in the same manner as in Example 14 except that the green-color photoemission layers were not formed.

Next, a green-color photoemissive electron transport layer 33a with a thickness of 100 nm, consisting of tris(8-quinolinolato)aluminum, was formed by vacuum deposition, and thereafter the cathode 4 was formed in the same manner as in Example 14 to obtain an organic-EL device.

To the device thus obtained, setting the ITO as the anode and the Mg/Ag as the cathode, a voltage of 10 V was applied by means of a DC power source, whereupon the green, red and blue three-color light was emitted in stripes.

EXAMPLE 19

A nineteenth working example is described below.

An organic-EL device having the green-color photoemissive electron transport layer 33a was obtained in the same manner as in Example 18 except that the green-color photoemissive electron transport layer 33a was formed using a photosensitive composition for forming green-color photoemissive electron transport layer, comprising 0.6 g of polymethyl methacrylate, 0.15 g of the aromatic bisazide represented by the structural formula (23), 0.05 g of coumarin-6, 0.35 g of the same oxadiazole derivative as that used in Example 1 and 10 g of N-methylpyrrolidone, which was patternwise printed by flexographic printing at the center area of the substrate, followed by exposure and development under the same conditions as those for the other photoemission layers.

To the device thus obtained, setting the ITO as the anode and the Mg/Ag as the cathode, a voltage of 10 V was applied by means of a DC power source, whereupon the green, red and blue three-color light was emitted in stripes.

EXAMPLE 20

A twentieth working example is described below.

The ITO electrodes, blue-color photoemissive hole transport layer, red-color photoemission layers, hole block layers and green-color photoemissive electron transport layer were formed on the surface of the substrate in the same manner as in Example 19.

Next, as shown in FIG. 34A, on the surface of the green-color photoemissive electron transport layer 33a, the electron transport layer 6 was formed in the same manner as in Example 14 except that the aromatic bisazide was mixed in an amount of 0.35 g. Thereafter, the cathode 4 was formed in the same manner as in Example 14 to obtain an organic-EL device shown in FIG. 34B.

To the device thus obtained, setting the ITO as the anode and the Mg/Ag as the cathode, a voltage of 10 V was applied by means of a DC power source, whereupon the green, red and blue three-color light was emitted in stripes.

According to the present invention, the photosensitive composition can readily cure upon exposure in air, and hence the devices can be mass-produced at a low cost in a large quantity. Also, the photosensitive composition has so high a viscosity that it is unnecessary to provide any gap between the photosensitive composition formed into a film and the mask, and hence precise exposure can be effected. Thus, the hole transport layer, photoemission layers and/or electron transport layer can be formed in well-precise and fine patterns.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

What is claimed is:

1. A process for producing an organic-electroluminescence device, comprising the steps of:

forming a film of a high-molecular weight compound composition which contains a) a high-molecular weight compound having a divalent organic group represented by the following Formula (2), and b) a bisazide compound;

followed by exposure and then development to form a photoemission layer in a prescribed pattern,

wherein W is a monovalent organic group containing at least one of an allyl group, an aryl group, an alkylene group, an alkyl group, an amide group, an ester group, a nitrile group, a carbonyl group, a carbazole group and a fluorene group.

2. The process for producing an organic-electroluminescence device according to claim 1, further comprising the steps of:
forming a film of a hole transport material having a photosensitivity,
followed by exposure and then curing to form a hole transport layer.

3. The process for producing an organic-electroluminescence device according to claim 2, wherein, in the organic-electroluminescence device produced, said film of the high molecular weight compound composition is between an anode and a cathode, and the hole transport layer is between the anode and the high molecular weight compound composition film.

4. The process for producing an organic-electroluminescence device according to claim 1, further comprising the steps of:
forming a film of an electron transport material having a photosensitivity,
followed by exposure and then curing to form an electron transport layer.

5. The process for producing an organic-electroluminescence device according to claim 4, wherein, in the organic-electroluminescence device produced, said film of the high molecular weight compound composition is between an anode and a cathode, and the electron transport layer is between the cathode and the high molecular weight compound composition film.

6. The process for producing an organic-electroluminescence device according to claim 1, further comprising the step of:
printing an ink containing an electron transport material so as to form an electron transport layer.

7. The process for producing an organic-electroluminescence device according to claim 1, further comprising the steps of:
printing an ink containing an electron transport material having a photosensitivity,
followed by exposure and then curing to form an electron transport layer.

8. The process for producing an organic-electroluminescence device according to claim 1, further comprising the step of:
forming an electron transport layer by evaporating an electron transport material.

9. The process for producing an organic-electroluminescence device according to claim 1, further comprising the steps of:
forming a film of a hole transport material which contains blue-photoemission material having a photosensitivity in all photoemission regions,
followed by exposure and then curing to form a hole transport layer which also functions as a blue-photoemission layer, and
forming a film of hole blocking material having a photosensitivity,
followed by exposure and then curing to form a hole blocking layer in a pattern on the blue-photoemission region.

10. A process for producing an organic-electroluminescence device, comprising the steps of:
forming a film of a high-molecular weight compound composition which contains a) a high-molecular weight compound having a divalent organic group represented by the following Formula (2), and b) a bisazide compound,
followed by exposure and then development to form a plurality of patterned layers having a plurality of photoemissions; and
forming an electron transport layer, having a different photoemisison compared with that of said plurality of patterned layers, so as to overlie both said plurality of patterned layers and a region not patterned,

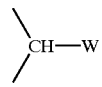
(2)

wherein W is a monovalent organic group containing at least one of an allyl group, an aryl group, an alkylene group, an, alkyl group, an amide group, an ester group, a nitrile group, a carbonyl group, a carbazole group and a fluorene group.

11. The process for producing an organic-electroluminescence device according to claim 10, further comprising the steps of:
forming a film of an electron transport material having a photosensitivity,
followed by exposure and then curing to form an electron transport layer which also functions as a photoemission layer.

12. The process for producing an organic-electroluminescence device according to claim 10, further comprising the step of:
printing an ink containing an electron transport material which contains a photoemission material, so as to form an electron transport layer which also functions as a photoemission layer.

13. The process for producing an organic-electroluminescence device according to claim 10, further comprising the steps of:
printing an ink containing an electron transport material which contains a photoemission material having a photosensitivity,
followed by exposure and then curing to form an electron transport layer which also functions as a photoemission layer.

14. The process for producing an organic-electroluminescence device according to claim 10, further comprising the step of:
forming an electron transport layer, which also functions as a photoemission layer, by evaporating an electron transport material which contains a photoemission material.

* * * * *